United States Patent
Nakajima et al.

(10) Patent No.: US 7,087,504 B2
(45) Date of Patent: Aug. 8, 2006

(54) METHOD OF MANUFACTURING A SEMICONDUCTOR DEVICE BY IRRADIATING WITH A LASER BEAM

(75) Inventors: Setsuo Nakajima, Kanagawa (JP); Aiko Shiga, Kanagawa (JP); Naoki Makita, Nara (JP); Takuya Matsuo, Osaka (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 91 days.

(21) Appl. No.: 10/133,588

(22) Filed: Apr. 29, 2002

(65) Prior Publication Data

US 2002/0173085 A1 Nov. 21, 2002

(30) Foreign Application Priority Data

May 18, 2001 (JP) ...................... 2001-148635

(51) Int. Cl.
*H01L 21/20* (2006.01)

(52) U.S. Cl. ................. 438/486; 438/149; 438/151
(58) Field of Classification Search ................. 438/149, 438/485, 486, 482, 160, 151, 480
See application file for complete search history.

(56) References Cited

U.S. PATENT DOCUMENTS

| | | |
|---|---|---|
| 4,292,093 A | 9/1981 | Ownby et al. |
| 4,552,595 A | 11/1985 | Hoga |

(Continued)

FOREIGN PATENT DOCUMENTS

| | | |
|---|---|---|
| JP | 58-015227 | 1/1983 |
| JP | 05-275336 | 10/1993 |
| JP | 07-183540 | 7/1995 |
| JP | 08-339960 | 12/1996 |
| JP | 09-186085 | 7/1997 |
| JP | 2001-210825 | 8/2001 |

OTHER PUBLICATIONS

Kubo et al., *Characteristics of Polycrystalline–Si Thin Film Transistors Fabricated by Excimer Laser Annealing Method*, IEEE Transactions on Electron Devices, vol. 41, No. 10, pp. 1876–1879, Oct. 1, 1994.

Kohno et al., *High Performance Poly–Si TFTs Fabricated Using Pulsed Laser Annealing and Remote Plasma CVD With Low Temperature Processing* IEEE Transactions on Electron Devices, vol. 42, No. 2, pp. 251–257, Feb. 1, 1995.

Brotherton et al., *Excimer–Laser–Annealed Poly–Si Thin–Film Transistors*, IEEE Transactions on Electron Devices, vol. 40, No. 2, pp. 407–413, Feb. 1, 1993.

A. Tam et al., *Laser–Cleaning Techniques for Removal of Surface Particulates*, J. Appl. Phys., vol. 71, No. 7, Apr. 1, 1992, pp. 3515–3523.

*Primary Examiner*—Bradley K. Smith
(74) *Attorney, Agent, or Firm*—Eric J. Robinson; Robinson Intellectual Property Law Office, P.C.

(57) ABSTRACT

A technique for manufacturing TFTs having little dispersion in their electrical characteristics is provided. Contamination of a semiconductor film is reduced by performing oxidation processing having an organic matter removing effect, forming a clean oxide film, after removing a natural oxide film formed on a semiconductor film surface. TFTs having little dispersion in their electrical characteristics can be obtained by using the semiconductor film thus obtained in active layers of the TFTs, and the electrical properties can be improved. In addition, deterioration in productivity and throughput can be reduced to a minimum by using a semiconductor manufacturing apparatus of the present invention.

9 Claims, 22 Drawing Sheets

(2 of 22 Drawing Sheet(s) Filed in Color)

U.S. PATENT DOCUMENTS

| | | |
|---|---|---|
| 4,559,091 A | 12/1985 | Allen et al. |
| 4,795,679 A | 1/1989 | Ramesh et al. |
| 4,863,561 A | 9/1989 | Freeman et al. |
| 4,942,058 A | 7/1990 | Sano |
| 5,024,968 A | 6/1991 | Engelsberg |
| 5,326,406 A | 7/1994 | Kaneko et al. |
| 5,352,291 A | 10/1994 | Zhang et al. |
| 5,365,875 A | 11/1994 | Asai et al. |
| 5,372,836 A | 12/1994 | Imahashi et al. |
| 5,382,316 A | 1/1995 | Hills et al. |
| 5,405,804 A | 4/1995 | Yabe |
| 5,413,958 A | 5/1995 | Imashashi et al. |
| 5,424,244 A | 6/1995 | Zhang et al. |
| 5,529,630 A | 6/1996 | Imahashi et al. |
| 5,593,497 A | 1/1997 | Matsuyama et al. |
| 5,612,250 A | 3/1997 | Ohtani et al. |
| 5,622,595 A | 4/1997 | Gupta et al. |
| 5,643,826 A | 7/1997 | Ohtani et al. |
| 5,648,282 A | 7/1997 | Yoneda |
| 5,651,839 A | 7/1997 | Rauf |
| 5,669,979 A | 9/1997 | Elliott et al. |
| 5,795,795 A | 8/1998 | Kousai et al. |
| 5,843,225 A | 12/1998 | Takayama et al. |
| 5,843,833 A | 12/1998 | Ohtani et al. |
| 5,854,096 A | 12/1998 | Ohtani et al. |
| 5,861,337 A | 1/1999 | Zhang et al. |
| 5,923,962 A | 7/1999 | Ohtani et al. |
| 5,958,268 A | 9/1999 | Engelsberg et al. |
| RE36,371 E | 11/1999 | Imahashi et al. |
| 5,994,172 A | 11/1999 | Ohtani et al. |
| 6,027,960 A | 2/2000 | Kusumoto et al. |
| 6,162,667 A | 12/2000 | Funai et al. |
| 6,184,068 B1 | 2/2001 | Ohtani et al. |
| 6,285,042 B1 | 9/2001 | Ohtani et al. |
| 6,326,248 B1 | 12/2001 | Ohtani et al. |
| 6,335,541 B1 | 1/2002 | Ohtani et al. |
| 6,348,369 B1 | 2/2002 | Kusumoto et al. |
| 6,589,824 B1 | 7/2003 | Ohtani et al. |
| 6,906,346 B1 | 6/2005 | Nishitani et al. |
| 2001/0001745 A1 | 5/2001 | Im et al. |
| 2002/0121287 A1 * | 9/2002 | Gilton ........................ 134/1.3 |
| 2002/0187594 A1 * | 12/2002 | Yamazaki et al. .......... 438/166 |
| 2003/0068872 A1 | 4/2003 | Kusumoto et al. |
| 2004/0005742 A1 | 1/2004 | Ohtani et al. |

\* cited by examiner

| STEP | TREATMENT | COMMENTS |
|---|---|---|
| 1 | NICKEL INTRODUCTION | SPUTTERING |
| 2 | HEAT TREATMENT | 550°C, 4 HOURS |
| 3 | A OR B | PROCESS A OR PROCESS B IN FIG. 1B |
| 4 | FORMATION OF GATE NINSULATING FILM | |
| 5 | FORMATION OF GATE ELECTRODE | TaN SINGLE LAYER 400nm |
| 6 | ACTIVATION | 550°C, 4 HOURS |
| 7 | HYDROGENATION | 410°C, 1 HOUR (NITROGEN ATMOSPHERE) |

FIG. 1A

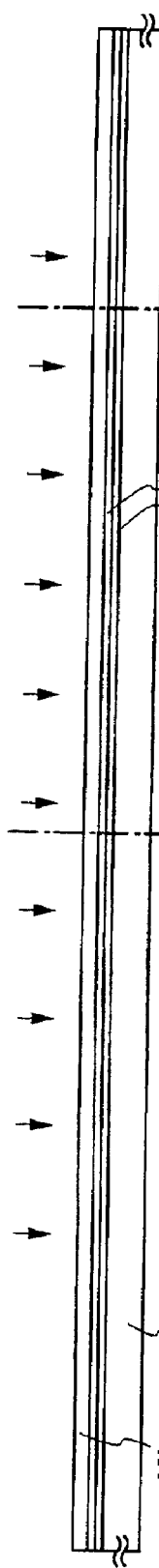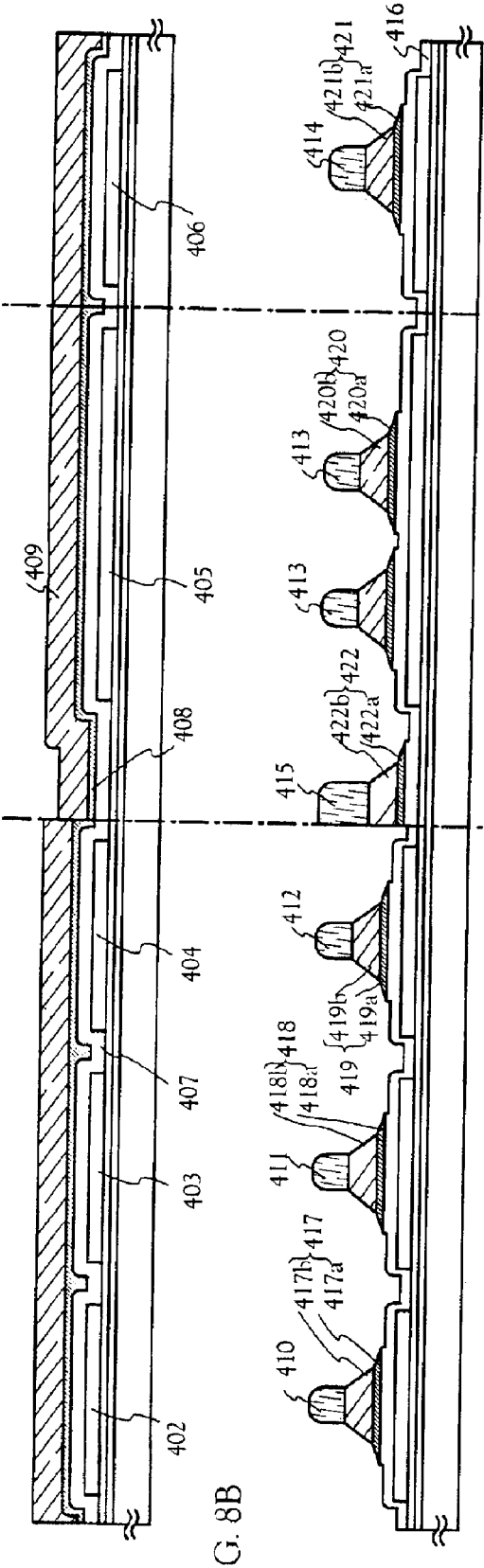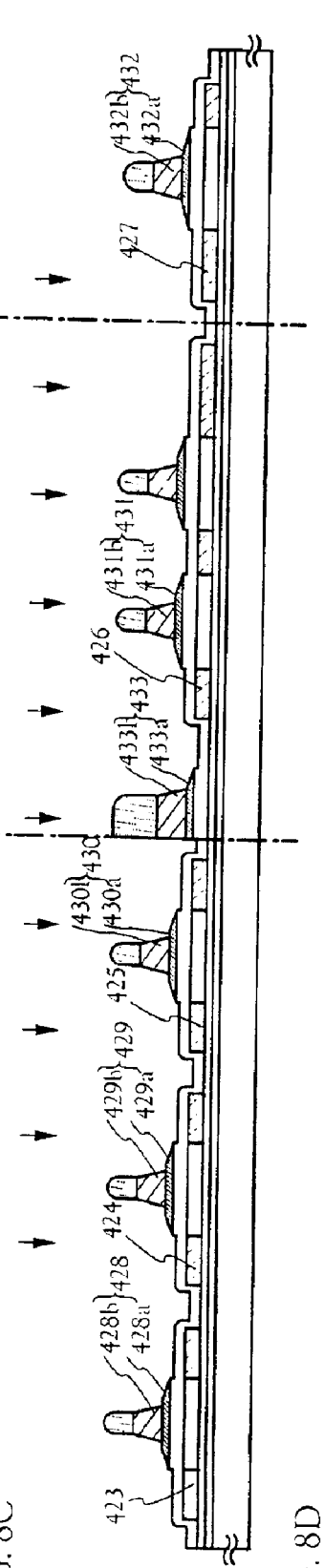
FIG. 8A
FIG. 8B
FIG. 8C
FIG. 8D

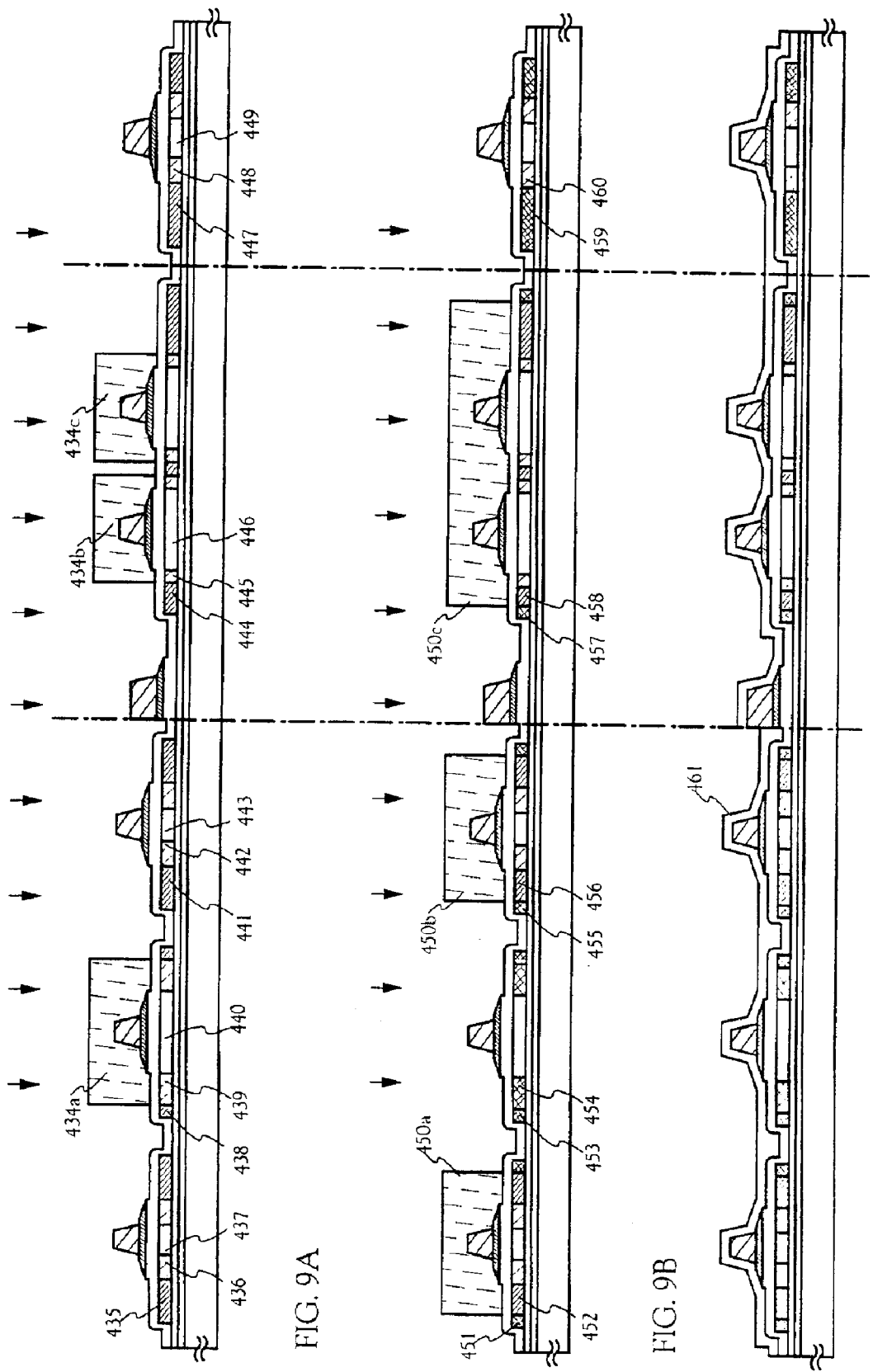

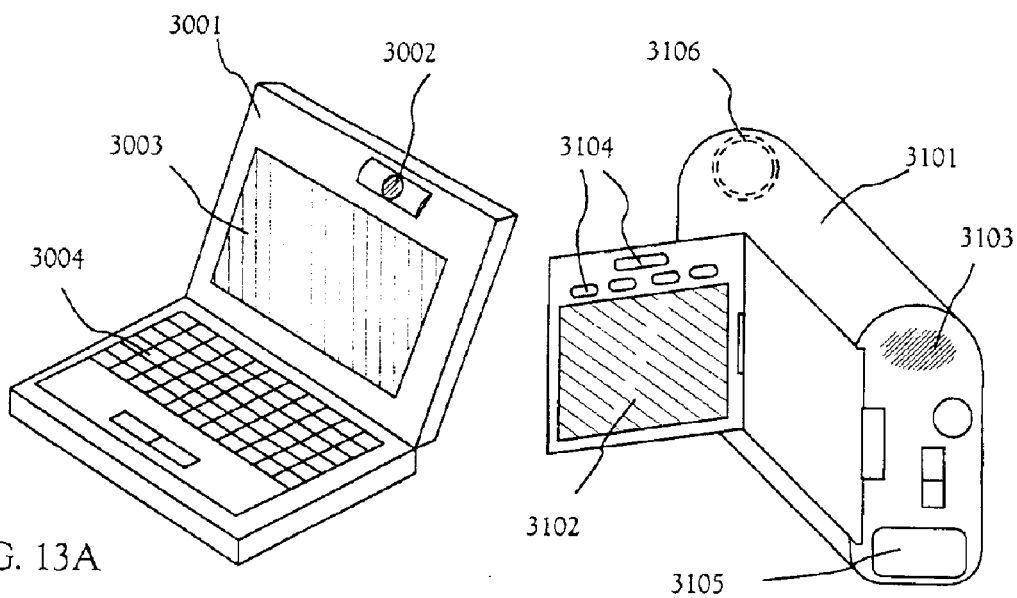
FIG. 13A
FIG. 13B
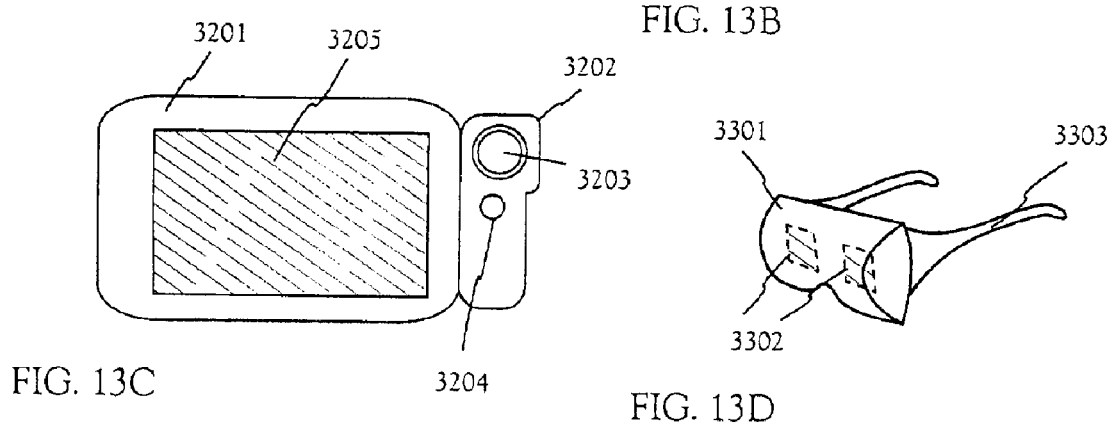
FIG. 13C
FIG. 13D
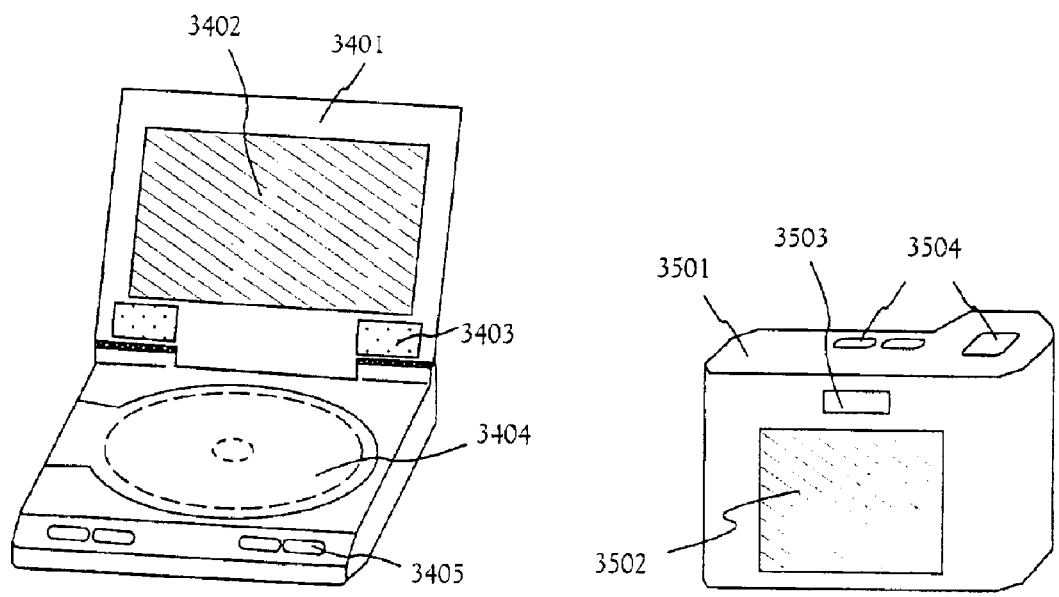
FIG. 13E
FIG. 13F

CORRELATION BETWEEN
S VALUE AND DOMAIN SIZE

CORRELATION BETWEEN
ELECTRIC FIELD EFFECT MOBILITY AND DOMAIN SIZE

METHOD OF MANUFACTURING A SEMICONDUCTOR DEVICE BY IRRADIATING WITH A LASER BEAM

BACKGROUND OF THE INVENTION

1. Field of the Invention

The present invention relates to a semiconductor device having circuits structured by thin film transistors (hereafter referred to as "TFTs"), and to a method of manufacturing a semiconductor device. The present invention relates, for example, to electro-optical devices, typically liquid crystal display devices, and to electronic equipment in which the electro-optical devices are installed as parts. Note that the term semiconductor device as used throughout this specification indicates general devices capable of functioning by utilizing semiconductor characteristic, and that the aforementioned electro-optical devices and electronic equipment fall within the category of semiconductor devices.

2. Description of the Related Art

Techniques of crystallizing, and increasing crystallinity of, an amorphous semiconductor film formed on an insulating substrate such as glass by performing heat treatment, laser annealing, or both heat treatment and laser annealing have been widely researched in recent years. Silicon is often used in the semiconductor film.

Crystallized semiconductor films obtained in accordance with the above techniques are referred to as crystalline semiconductor films. The crystalline semiconductor films have extremely high mobility comparison with amorphous semiconductor films. A monolithic type liquid crystal electro-optical device (a semiconductor device in which thin film transistors (TFTs) for a pixel driver and a driver circuit are manufactured on one substrate) which cannot be achieved using semiconductor devices manufactured by conventional amorphous semiconductor films, for example, can therefore be manufactured if crystalline semiconductor films are utilized.

Crystalline semiconductor films are thus semiconductor films having extremely good characteristics compared to amorphous semiconductor films, and this is the reason the above stated research is being carried out. For example, it is necessary to have a heat treatment temperature equal to or greater than 600° C., and a heat treatment time equal to or greater than 10 hours, preferably equal to or greater than 20 hours, when performing crystallization of an amorphous semiconductor film by using heat treatment. Substrates which can withstand these crystallization conditions include quartz substrates, for example. However, quartz substrate is high cost, and processing a quartz substrate to have a large surface area is extremely difficult. Increasing the surface area of the substrate is indispensable particularly for raising mass production efficiency. Work toward increasing the surface area of substrates in order to increase mass production efficiency has been remarkable in recent years.

The processing of a quartz substrate into this type of large surface area substrate is difficult with present techniques, and even if it were possible, would not happen at present due to the costs of production beyond a profit. Glass is available, for example, as a material which can easily be manufactured into a large surface area substrate. A glass substrate referred to as Corning #7059 exists as this type of glass substrate, for example. Corning #7059 is extremely low cost, and is easily made into a large surface area substrate. However, Corning #7059 has a distortion temperature of 593° C., and heat treatment at 600° C. or higher causes a problem.

Corning #1737 is a glass substrate with a relatively high distortion temperature. The distortion temperature is high at 667° C. If an amorphous semiconductor film is formed on a Corning #1737 substrate, and the substrate is then placed in an atmosphere of 600° C. for 20 hours, there is almost no change in shape of the substrate which will influence manufacturing steps. However, a heat treatment time of 20 hours is too long to be used as a mass production process, and from the point of view of costs, it is preferable to lower the heat treatment temperature of 600° C., even by a small amount.

A novel method for crystallization has been proposed in order to resolve these types of problems. This method is recorded in detail in Japanese Patent Application Laid-open No. Hei 7-183540, and a simple explanation thereof is presented here. First, a very small amount of an element such as nickel, palladium, or lead is introduced into an amorphous substrate. Methods such as plasma processing, evaporation, ion injection, sputtering, and liquid application can be utilized as the introduction method. Thereafter, if the amorphous semiconductor film is placed, for example, in a nitrogen atmosphere at 550° C. for 4 hours, a crystalline semiconductor film having good characteristics can be obtained. The optimal heat treatment temperature and heat treatment time are dependent upon the amount of the element introduced and the state of the amorphous semiconductor film.

A method of crystalizing an amorphous semiconductor film in accordance with heat treatment is discussed above by way of an example. On the contrary, the temperature of the substrate does not increase very much with crystallization by laser annealing, and high energy can be imparted to only the amorphous semiconductor film. Therefore, it can be applied to substrates such as plastic substrates, in addition to low distortion temperature glass substrates.

Lasers such as XeCl excimer lasers and KrF excimer lasers can be given as examples of the types of lasers that can be used in laser annealing. A method of performing laser annealing in which: a pulse laser beam from a high output excimer laser is processed into a square spot of several centimeters in side, or into a linear shape having a length equal to or greater than 10 cm, on a surface to be irradiated by an optical system; and in which the laser beam is then scanned (or the laser beam irradiation position is moved relatively to the surface to be irradiated) has high mass-productivity and is industrially superior. This method is preferably used.

In particular, if a beam made from a laser beam having a linear shape (hereafter, referred to as a linear shape beam) in the irradiation surface is used, then the entire irradiation surface can be irradiated by scanning the linear shape beam only in a direction perpendicular to the longitudinal axis of the linear shape beam. This differs from the use of a spot shape laser beam, in which it is necessary to scan forward and backward, and to the left and right. Productivity is therefore high. Scanning in a direction perpendicular to the linear direction is performed because this is the most efficient scanning direction. In terms of its high productivity, pulse oscillation type excimer lasers, processed into a linear shape beam by a suitable optical system, for laser annealing are being mainly used in the present day.

Further, there is an additional method of performing crystallization of an amorphous semiconductor film by laser annealing, after crystallization is performed in accordance with heat treatment, in order to obtain a semiconductor film having very good electrical characteristics. The semiconductor film characteristics can be improved if this method is used, compared to cases of performing only heat treatment or only laser annealing.

Removal of a natural oxide film is often performed as a preprocess to laser annealing in order to prevent surface roughness. The composition and film thickness of the natural oxide film are uncontrolled, and may therefore be a cause of contamination and dispersion in characteristics. In particular, removal of the natural oxide film as a preprocess to laser annealing is also effective in removing portions having a high metallic element concentration for cases in which a metallic element is introduced into this type of amorphous semiconductor film, and laser annealing is performed after heat treatment. This is very important in order to obtain highly stable semiconductor films having little dispersion in their characteristics. A detailed explanation of this method is recorded in Japanese Patent Application Laid-open No. Hei 8-339960.

Further, it is known that convex portions, called ridges, can be formed in the film surface if laser annealing is performed on the semiconductor film, performing crystallization (such convex portions are hereafter referred to as "ridges"). The semiconductor film instantaneously melts and locally expands if laser light is irradiated to the semiconductor film, and the ridges are formed in the surface of the crystalline semiconductor film in order to relieve internal stresses that develop in accordance with this expansion. The elevation difference of the ridges is on the order of 0.5 to 2 times the film thickness.

Potential barriers and trap levels are formed in the ridges on the surface of the crystalline semiconductor film due to dangling bonds and lattice distortions, and therefore the boundary level between an active layer (semiconductor layer containing a channel forming region, a source region, and a drain region) and a gate insulating film becomes high for insulating gate type semiconductor devices. Further, the peak portions of the ridges are precipitously steep, and therefore electric fields are easily concentrated there and this becomes a generation source for a leak current. Finally insulation breakdown develops, and short circuits are formed. In addition, the ridges in the surface of the crystalline semiconductor film can damage the film coating properties of a gate insulating film formed by sputtering or CVD, and the reliability is lowered due to insulation defects and the like. Further, one factor in determining the electric field effect mobility for TFTs is the surface scattering effect. The levelness of the interface between the active layer of the TFT and the gate insulating film imparts influence to the electric field effect mobility, and the more level the interface is, the less influence by scattering is, and a high electric field effect mobility can be obtained.

From the above discussion, it can be said that it is preferable that the ridges be low. The ridges are made lower if laser annealing is performed in an inert gas atmosphere, compared to laser annealing performed in the ambient air atmosphere, but the crystal grain size becomes smaller, and the electrical characteristics of the TFTs become poor.

However, it has been reported that the ridges can be reduced while maintaining a large crystal grain size by performing laser annealing within the ambient atmosphere, performing hydrofluoric acid processing and removing an oxide film, and then performing laser annealing in an inert gas atmosphere.

Contamination due to metallic impurities and organic substances exerts a great influence on the electrical characteristics of semiconductor devices. Metallic impurity contamination causes defects such as oxidation film withstand voltage defects and a lowering in the carrier lifetime, and fatally degrades the electrical characteristics. For example, the surface of a silicon film is easily contaminated, and in particular, metals having a larger electronegativity than silicon directly take away electrons from silicon, chemically bond with silicon, and are difficult to remove. Metallic atoms that have a smaller electronegativity than silicon are not directly adsorbed onto the surface of a bare silicon film, but are oxidized more easily than silicon, and therefore are incorporated within a natural oxide film formed on the silicon film surface.

Organic substance contamination exerts influence on the electrical characteristics of oxide films. The withstand voltage can be reduced by forming an oxide film after removing organic substances on the surface of the semiconductor film by a method such as cleaning using a liquid mixture of sulfuric acid and hydrogen peroxide (hereafter, referred to as a sulfuric acid and hydrogen peroxide mixture) or cleaning using aqueous ozone. A solution in which sulfuric acid, $H_2SO_4$ (97%), and hydrogen peroxide are mixed at a composition ratio of 4:1 to 6:1 is often used as the mixture of sulfuric acid and hydrogen peroxide. Heat is generated at the same time when both liquids are mixed, reaching a temperature of 100 to 120° C. Further, the withstand voltage of the oxide film depends on the degree of organic substance contamination, and is a cause of dispersion in characteristics. A large amount of organic substances exist in the ambient air atmosphere of a clean room, and the amount of organic substances adsorbed increases with time. A large amount of moisture also exists, and if absorbed onto the film surface, the moisture promotes growth of a natural oxide film. It is also possible for metals and organic substances dissolved within the moisture to cause contamination.

It is necessary to remove a natural oxide film formed on the surface of a semiconductor film as a preprocess to laser annealing when performing crystallization by laser annealing after introducing a metallic element into an amorphous semiconductor film and then performing heat treatment. However, the surface of the semiconductor film is easily contaminated with impurities, which are difficult to remove. Semiconductor film contamination exerts great influence on the electrical characteristics of thin film transistors (TFTs) using the semiconductor film as an active layer, and can cause dispersion in the electrical characteristics.

SUMMARY OF THE INVENTION

The present invention has been made in view of the above-mentioned problems and an object of the present invention is to suppress dispersion in the electrical characteristics of TFTs manufactured based on semiconductor films, and to improve their electrical characteristics, by removing a natural oxide film that is a cause of contamination and dispersion during laser annealing, and by reducing impurity contamination of the semiconductor film surface which is susceptible to contamination.

Further, it has been reported that ridges can be reduced while maintaining a large crystal grain size by performing a second laser annealing in an inert gas atmosphere after performing a first laser annealing in the ambient air atmosphere and then performing hydrofluoric acid processing, removing an oxide film. With this method, however, the atmosphere used for laser annealing must be changed between the first laser anneal and the second laser anneal, which is a problem for productivity and throughput.

Another object of the present invention, therefore, is to manufacture a semiconductor film in which ridges are efficiently reduced without changing the atmosphere used during laser annealing, thus suppressing dispersion in the electrical characteristics of TFTs manufactured based on semiconductor films, and improving their electrical characteristics.

Further, it is necessary to perform laser annealing preprocessing and laser annealing by using separate apparatuses at present, and performing processing by using a plurality of apparatus leads to a problem in that productivity, and throughput are greatly reduced.

Therefore, another object of the present invention is to manufacture a crystalline semiconductor film in which impurity contamination is reduced, and to manufacture a semiconductor film in which ridges are reduced, while keeping reductions in productivity and throughput to a minimum, thus suppressing dispersion in the electrical characteristics of TFTs manufactured based on the semiconductor films, and improving their electrical characteristics.

In order to achieve the above-mentioned objects, according to one aspect of the present invention, a natural oxide film is removed, and then, oxidation processing (preferably oxidation processing having an organic substance removal effect) is performed, a semiconductor film surface is covered by a clean oxide film, and then laser annealing is performed, reducing impurity contamination to the semiconductor film surface when performing laser annealing after introducing a metallic element into an amorphous semiconductor film to perform a heat treatment.

Organic substance contamination of the semiconductor film surface, which causes dispersion in the electrical characteristics of TFTs, can be reduced by using oxidation processing having an organic substance removal effect, such as ozone water processing, irradiation of UV light within an oxygen atmosphere, or processing with a sulfuric acid and hydrogen peroxide mixture. Further stabilization of the electrical characteristics can be achieved.

Specifically, a small amount of an element (for example, a metallic element for promoting crystallization) is introduced onto an amorphous semiconductor film formed on an insulating substrate, and heat treatment is performed, crystallizing a portion of, or the entire, amorphous semiconductor film. A natural oxide film, whose composition and film thickness are not controlled, on the surface of the crystalline semiconductor film is then removed, along with localized metallic elements, by performing hydrofluoric acid processing (etching processing) using an etching solution containing diluted hydrofluoric acid to a suitable concentration, buffered hydrofluoric acid, or hydrofluoric acid. In addition, laser annealing is perform after covering the surface of the semiconductor film with a clean oxide film, formed by performing oxidation processing having an organic substance removal effect, such as ozone water processing, irradiation of UV light within an oxygen atmosphere, or processing with a sulfuric acid and hydrogen peroxide mixture. The surface of the semiconductor film appearing due to removal of the oxide film is easily contaminated as discussed above, but compared to this, there allows only physical adsorption on the surface with respect to the oxide film, and therefore impurity contamination can be reduced by covering the semiconductor film surface by the oxide film. Dispersion in the electrical characteristics of TFTs can be reduced, and the electrical characteristics can be stabilized.

Furthermore, according to another aspect of the invention, a laser processing apparatus for consecutive processing is used with substrates maintained in a nitrogen atmosphere during performing the following processes an arbitrary number of times and in a non-specified order: hydrofluoric acid processing as a laser annealing preprocess, oxidation processing, heat treatment, and laser annealing.

Further, still another aspect of the present invention is characterized by comprising: a first step of introducing a metallic element into an amorphous semiconductor film formed over a substrate; a second step of forming a first crystalline semiconductor film by performing heat treatment of the amorphous semiconductor film; a third step of removing an oxide film formed on the surface of the first crystalline semiconductor film; a fourth step of forming a clean oxide film by performing oxidation processing, which has an organic substance removal effect, on the first crystalline semiconductor film; and a fifth step of forming a second crystalline semiconductor film by irradiating a laser beam on the first crystalline semiconductor film within an inert gas atmosphere.

Further, yet another aspect of the present invention is characterized by comprising: a first step of introducing a metallic element into an amorphous semiconductor film formed over a substrate; a second step of forming a first crystalline semiconductor film by performing heat treatment of the amorphous semiconductor film; a third step of removing an oxide film formed on the surface of the first crystalline semiconductor film; a fourth step of forming a clean oxide film by performing oxidation processing, which has an organic substance removal effect, on the first crystalline semiconductor film; and a fifth step of forming a second crystalline semiconductor film by irradiating a laser beam on the first crystalline semiconductor film within an inert gas atmosphere having an oxygen concentration equal to or less than 20 ppm.

Further, yet still another aspect of the present invention is characterized by comprising: a first step of introducing a metallic element into an amorphous semiconductor film formed over a substrate; a second step of forming a first crystalline semiconductor film by performing heat treatment of the amorphous semiconductor film; a third step of removing an oxide film formed on the surface of the first crystalline semiconductor film; a fourth step of forming a clean oxide film by performing oxidation processing, which has an organic substance removal effect, on the first crystalline semiconductor film; a fifth step of forming a second crystalline semiconductor film by irradiating a laser beam on the first crystalline semiconductor film in an inert gas atmosphere having an oxygen concentration equal to or less than 20 ppm; a sixth step of removing an oxide film formed on the surface of the second crystalline semiconductor film; and a seventh step of irradiating a laser beam on the second crystalline semiconductor film in an inert gas atmosphere having an oxygen concentration equal to or less than 20 ppm.

Further, in the aforementioned aspect of the present invention, the third step is a step of removing an oxide film by using hydrofluoric acid, and the fourth step is a step of forming an oxide film by spraying ozone water.

Further, in the aforementioned aspect of the present invention, the third step is a step of removing an oxide film by using hydrofluoric acid, and the fourth step is a step of forming an oxide film by irradiating UV light.

Further, in the aforementioned aspect of the present invention, the third step is a step of removing an oxide film by using hydrofluoric acid, and the fourth step is a step of forming an oxide film by applying a sulfuric acid and hydrogen peroxide mixture.

In the aforementioned aspect of the present invention, the inert gas atmosphere is nitrogen, hydrogen, or a rare gas.

Further, in the aforementioned aspect of the present invention, the amorphous semiconductor film is an amorphous silicon film.

Further, the first crystalline semiconductor film in the above structure is a crystalline silicon film.

Further, in the aforementioned aspect of the present invention, the second crystalline semiconductor film is a crystalline silicon film.

Further another aspect of the present invention relates to a semiconductor manufacturing apparatus, comprising: an oxide film removal chamber for performing removal of an oxide film formed on the surface of a first crystalline semiconductor film formed over a substrate; an oxidation processing chamber for removing organic substances on the surface of the first crystalline semiconductor film and performing oxidation processing; and a laser processing chamber for performing irradiation of a laser beam on the first crystalline semiconductor film, forming a second crystalline semiconductor film.

Further another aspect of the present invention is characterized by comprising: an oxide film removal chamber for performing removal of an oxide film formed on the surface of a first crystalline semiconductor film formed on a substrate; an oxidation processing chamber having chemical nozzles as a means of removing organic substances on the surface of the first crystalline semiconductor film and performing oxidation; and a laser processing chamber for performing irradiation of a laser beam on the first crystalline semiconductor film, forming a second crystalline semiconductor film.

Further another aspect of the present invention is characterized by comprising: an oxide film removal chamber for performing removal of an oxide film formed on the surface of a first crystalline semiconductor film formed over a substrate; an oxidation processing chamber having means of irradiating UV light as means of removing organic substances on the surface of the first crystalline semiconductor film; performing oxidation; and a laser processing chamber for performing irradiation of a laser beam on the first crystalline semiconductor film, forming a second crystalline semiconductor film.

Further, another aspect of the present invention is characterized by comprising: an oxide removal chamber for performing removal of an oxide film formed on the surface of a first crystalline semiconductor film formed over a substrate; an oxidation processing chamber having chemical nozzles as a means of removing organic substances on the surface of the first crystalline semiconductor film; performing oxidation; and a laser processing chamber for performing irradiation of a laser beam on the first crystalline semiconductor film in an inert gas atmosphere having an oxygen concentration equal to or less than 20 ppm, forming a second crystalline semiconductor film.

Further, another aspect of the present invention is characterized by comprising: an oxide removal chamber for performing removal of an oxide film formed on the surface of a first crystalline semiconductor film formed over a substrate; an oxidation processing chamber having means of irradiating UV light as a means of removing organic substances on the surface of the first crystalline semiconductor film and performing oxidation; and a laser processing chamber for performing irradiation of a laser beam on the first crystalline semiconductor film in an inert gas atmosphere having an oxygen concentration equal to or less than 20 ppm, forming a second crystalline semiconductor film.

Further, in the above aspect of the present invention, the semiconductor manufacturing apparatus further comprises a conveying chamber that has a mechanism for conveying substrates, wherein the oxide film removal chamber, the oxidation processing chamber, and the laser processing chamber are connected to the conveyor chamber through gate valves.

Further, in the above aspect of the present invention, the chemical nozzles are nozzles for spraying ozone water or a liquid mixture of sulfuric acid and hydrogen peroxide.

According to a further another aspect of the present invention, by using the above laser processing apparatus, substrates are maintained in an inert gas atmosphere having an oxygen concentration equal to or less than 20 ppm during performing steps of removing a natural oxide film, performing oxidation processing, and performing laser annealing in an inert gas atmosphere. The period of time that the semiconductor film surface is exposed can thus be shortened, and laser annealing can be completed without exposing the semiconductor film surface to contaminated atmosphere. The electrical characteristics of TFTs can be additionally improved.

Note that the inert gas atmosphere is nitrogen, hydrogen, or a rare gas. Further, the rare gas is argon, neon, helium, xenon, or krypton.

According to a further another aspect of the present invention, a semiconductor film is manufactured in which ridges are efficiently reduced without changing the atmosphere used during laser annealing, by performing the following process in which a natural oxide film is removed, oxidation processing is performed with covering the semiconductor film with an oxide film, laser annealing is performed in an inert gas atmosphere, hydrofluoric acid processing is performed, and then laser annealing is again performed in an inert gas atmosphere.

Further, according to a further another aspect of the present invention, by using the above laser processing apparatus, substrates are maintained in an inert gas atmosphere having an oxygen concentration equal to or less than 20 ppm during performing steps of removing a natural oxide film, performing oxidation processing, performing laser annealing in an inert gas atmosphere, and in addition, performing hydrofluoric acid processing, and performing laser annealing in an inert gas atmosphere. Semiconductor films in which ridges are thus reduced, and in which impurities are reduced, can thus be efficiently manufactured.

In the above aspect of the invention, crystal growth is preferably performed well if the metallic element is one element, or a plurality of elements, selected from the group consisting of Ni, Pd, Pt, Cu, Ag, Au, Al, In, Sn, and Pd.

In the above aspect of the invention, crystal growth is preferably performed well if the metallic element is one element, or a plurality of elements, selected from the group consisting of elements belonging to group 8, group 11, group 13, group 14, and group 15 of the periodic table.

Note that a detailed physical analysis of semiconductor films manufactured using the present invention was performed, and their properties are shown below.

EBSP (electron back scatter diffraction patterning) is the method used in the physical analysis. The orientation in microscopic regions of the film can be investigated in detail by scanning an electron beam and analyzing the Kikuchi pattern obtained by back scattering.

Typical analysis results are shown in FIG. 16. Further, results of evaluating general poly-Si films in which a-Si is crystallized using only an excimer laser, without using the present invention, are shown in FIG. 17. The results are of analysis by a method referred to as unique grain mapping. Specifically, a sample is scanned with an electron beam, and the orientation of each point is found. Regions in which a change in orientation between adjacent measured points is less than 15° are shown by the same color.

Clear difference can be seen between the semiconductor films of the present invention and the semiconductor films crystallized by only using a laser, generally referred to as low temperature poly-Si, (hereafter referred to as LPS films). A nearly random orientation can be seen at each measurement point in the low temperature poly-Si films. With the semiconductor films of the present invention, however, a state was observed in which regions having little difference in orientation between the adjacent measured points form aggregates having a size on the order of several μm.

LPS film evaluation results are results of performing evaluation using a 0.2 μm step gap, and this shows that crystal grains having a grain size equal to or less than 0.2 μm have large tilt grain boundary equal to or greater than 15° in the grain boundaries.

On the other hand, this shows that there are poly-Si grains with a size of several μm, or that crystal grains possessing small tilt angle grain boundaries less than 15° are gathered together, forming regions having a size of several μm (hereafter referred to as domains) in the semiconductor film of the present invention. Grains having a size of several μm were not seen by SEM observation (FIG. 18), but crystal grain boundaries having a space of several hundreds of nm were observed. It can therefore be determined that the semiconductor films of the present invention are aggregates of crystal grains having small tilt angle grain boundaries.

Small tilt angle grain boundaries have fewer defects (silicon dangling bonds) contained in the grain boundaries, and have a smaller electrical barriers. That is, inside of the domains can be considered to approximate a single crystal, and the characteristics can be considered to improve with increasing domain size.

The relationship between the domain size and the characteristics of TFTs manufactured using these domains is shown in FIGS. 19 and 20. The correlation between the S value of the TFTs and the domain size, and the correlation between the domain size and the electric field effect mobility of the TFTs are shown in FIG. 19 and FIG. 20, respectively. The average surface area of the domains was computed, and the domain size was defined as the diameter of a circle possessing the average surface area. It can be seen that extremely good characteristics can be obtained if the domain size is equal to or greater than 1 μm (preferably equal to or greater than 5 μm). In other words, it is clear that good characteristics can be obtained when the number of large tilt angle boundaries cutting across the domain is small.

If the domain size is 1 μm, then one or fewer large tilt angle grain boundary will cut across per one μm with respect to a linear electric current path. Naturally, a larger number of small tilt angle grain boundaries will cut across, but the electrical barrier is small, and therefore their influence is small.

The above analysis results are summarized. A polycrystalline semiconductor film is used as an active layer, large tilt angle grain boundaries and small tilt angle grain boundaries are contained in the active layer, and the number of grain boundaries cutting across when electric current flows in the active layer is equal to or less than one per μm of electric current path length for large tilt angle grain boundaries, and is equal to or greater than one per μm of electric current path length for small tilt angle grain boundaries. The small tilt angle grain boundaries have differences in orientation less than 15° in their grain boundaries.

A polycrystalline semiconductor film is used as an active layer, and the active layer contains large tilt angle grain boundaries and small tilt angle grain boundaries. The average size of aggregates of crystal grains having small tilt angle grain boundaries is equal to or greater than 1 μm, and the small tilt angle grain boundaries have differences in orientation less than 15° in their grain boundaries.

Further, there is 0.2 or fewer large tilt angle grain boundary per μm of electric current path length.

In addition, the average size of the aggregates of crystal grains is equal to or greater than 5 μm.

BRIEF DESCRIPTION OF THE DRAWINGS

The patent or application file contains drawings executed in color. Copies of this patent or patent application publication with color drawings will be provided by the Office upon request and payment of the necessary fee.

FIGS. 1A and 1B are a step chart and a diagram showing the dependence of TFT characteristics upon a laser annealing preprocess of the present invention;

FIGS. 8A to 8D are cross sectional diagrams showing a process of manufacturing a pixel TFT and driver circuit TFTs of Embodiment 8;

FIGS. 9A to 9C are cross sectional diagrams showing the process of manufacturing a pixel TFT and driver circuit TFTs of Embodiment 8;

FIGS. 13A to 13F are diagrams showing examples of electric apparatuses of Embodiment 10;

DETAILED DESCRIPTION OF THE PREFERRED EMBODIMENTS

[Embodiment Mode 1]

An explanation is given using FIGS. 2A to 2E for a method of manufacturing a crystalline semiconductor film having reduced impurity contamination. A natural oxide film is removed, an oxidation process is performed, and laser annealing is performed when implementing laser annealing after introducing a metallic element into an amorphous semiconductor film and performing heat treatment. Note that the amorphous semiconductor film is an amorphous silicon film, and that the crystalline semiconductor film is a crystalline silicon film.

A base insulating film 102 is formed first on a substrate 101. An insulating film such as a silicon oxide film, a silicon nitride film, or a silicon oxynitride film is formed as the base film 102. An example of using a single layer structure as the base film 102 is shown here, but a structure in which two or more layers of insulating films are laminated together may also be used.

Figure 2A:
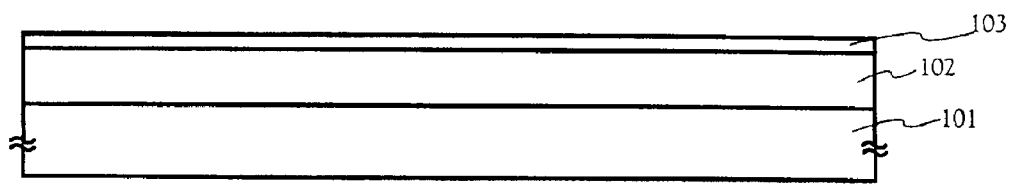
FIGS. 2A to 2E are cross sectional diagrams showing manufacturing processes in accordance with Embodiment Mode 1 and embodiments 1 to 3 of the present invention.

A semiconductor film 103 is formed next on the base insulating film 102. The semiconductor film 103 is formed by a known means (such as sputtering, LPCVD, or plasma CVD) from a semiconductor film having an amorphous structure. The thickness of the semiconductor film 103 is from 25 to 80 nm (preferably between 30 and 60 nm) (FIG. 2A).

A small amount of an element (a metallic element for promoting crystallization, for example nickel) is then introduced to the semiconductor film 103, and heat treatment is performed. A portion of, or the entire, semiconductor film is crystallized by the heat treatment, and a crystalline semiconductor film 104 is obtained.

Figure 2B:
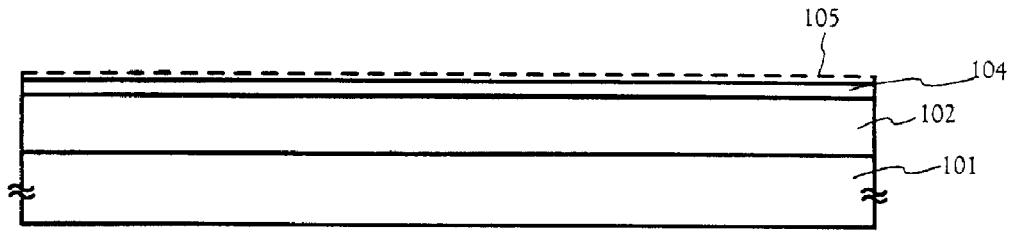
Figure 2C:
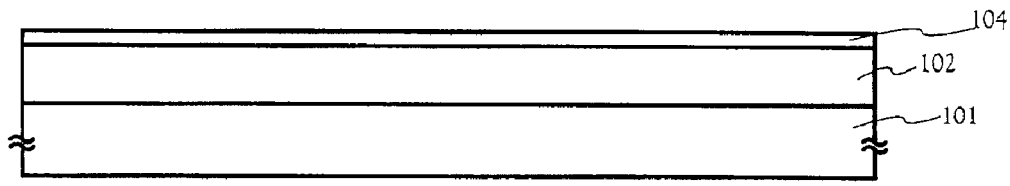
Figure 2D:
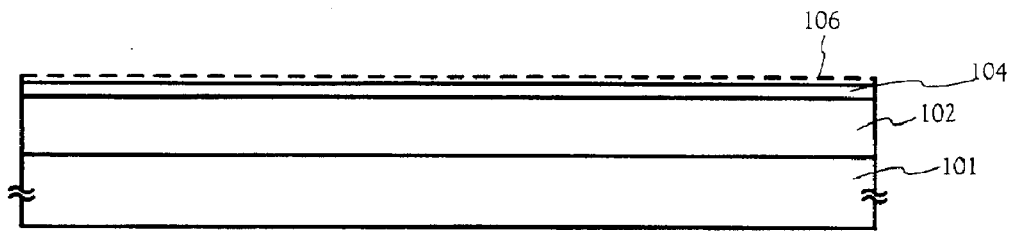
Figure 2E:
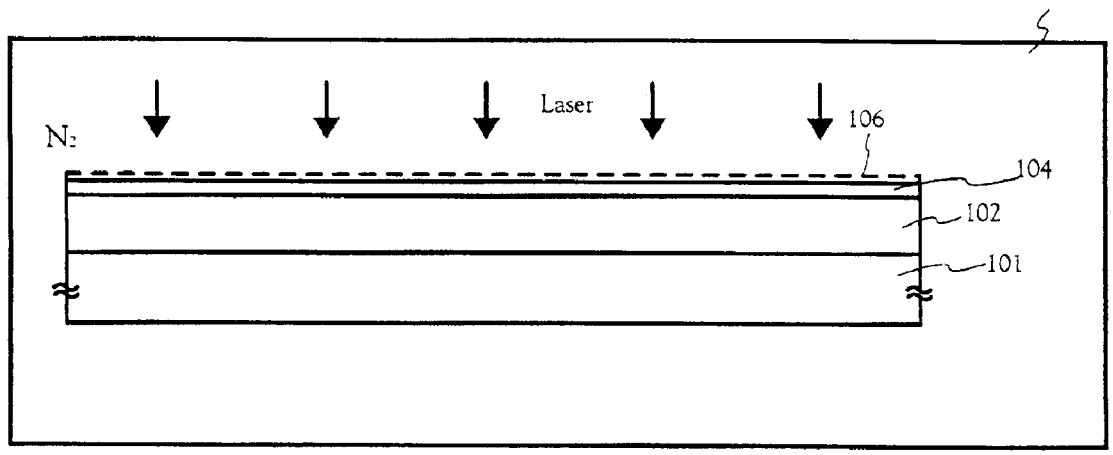

Annealing is performed using a laser beam on the crystalline semiconductor film 104 obtained by heat treatment. First, hydrofluoric acid processing (etching) is performed, removing an oxide film 105, by spraying for 30 to 90 seconds using hydrofluoric acid diluted to a suitable concentration (on the order of 0.2 to 1%). Hydrofluoric acid at a 0.5% concentration is used in Embodiment Mode 1, and the hydrofluoric acid is sprayed for 70 seconds onto the processing substrate while rotating the processing substrate, thereby removing the oxide film 105. The surface of the semiconductor film is cleaned by rinsing with pure water after removing the oxide film. The natural oxide film 105 on the surface of the crystalline semiconductor film, whose composition and film thickness are uncontrolled, and localized metallic elements are removed (FIGS. 2B and 2C). Further, the impurity removal effect can be increased by oxidizing impurities, such as metallic elements on the surface of the semiconductor film, by using a solvent having strong oxidizing ability, such as ozone water, before hydrofluoric acid processing, and removing these by etching with an etchant containing hydrofluoric acid. In addition, after forming an oxide film 106 on the semiconductor film 104 by performing oxidation processing (preferably oxidation processing having an organic substance removal effect) (FIG. 2D), a laser beam is irradiated, performing laser annealing (FIG. 2E). Ozone water processing, irradiation of UV light in an oxygen atmosphere, or processing with a sulfuric acid and hydrogen peroxide mixture, may be performed as the oxidation process. Furthermore, it is preferable to perform laser annealing within an inert gas atmosphere (for example, a nitrogen atmosphere) having an oxygen concentration equal to or less than 20 ppm. In addition to nitrogen, hydrogen and rare gasses may also be used. The rare gas refers to argon, neon, helium, xenon, or krypton.

A laser oscillator used in laser annealing is explained. Excimer lasers at present can output high repetition pulses on the order of 300 Hz, at high power, and therefore are often used. Further, lasers such as continuous emission excimer lasers, Ar lasers, and YAG lasers can also be used in addition to pulse emission excimer lasers.

Figure 1B:
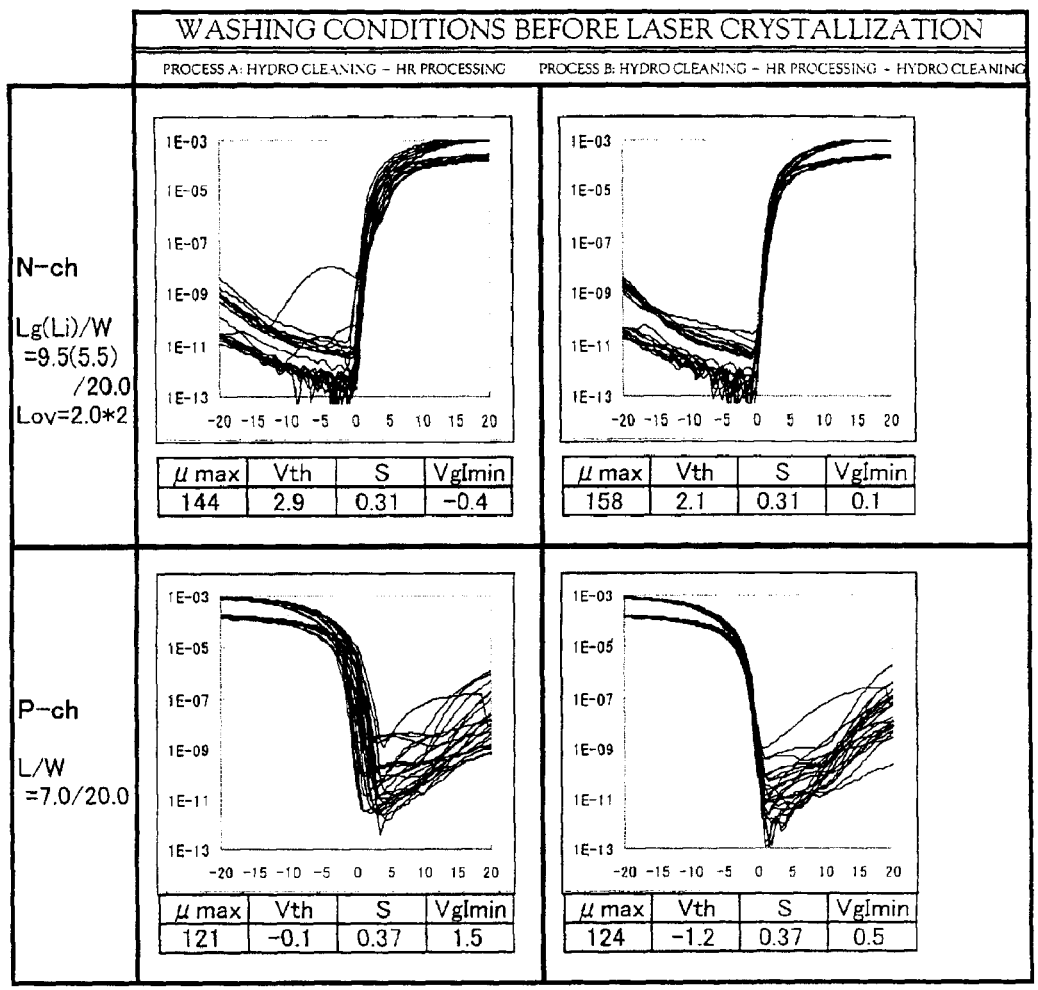

FIG. 1B shows the Vg-Id characteristics for TFTs using as active layers: a crystalline semiconductor film in which hydrofluoric acid processing (HF processing) is performed after cleaning using ozone water (hydro cleaning) as a laser annealing preprocess (Process A); and a crystalline semiconductor film in which another ozone water processing (hydro cleaning) is performed additionally after the hydrofluoric acid processing (Process B), respectively. Each of the Process A and Process B is performed as the preprocess of the laser annealing, in the Step 3 in FIG. 1A. It can be clearly seen that the dispersion in the threshold voltage becomes smaller for the TFTs using the crystalline semiconductor film in their active layers (hydro cleaning+HF processing+hydro cleaning) (Process B), as compared to the TFTs using the crystalline semiconductor film in their active layers (hydro cleaning+HF processing) (Process A).

In addition, it can be seen that a high mobility is obtained and the TFT electrical characteristics are improved for the TFTs using the crystalline semiconductor film in their active layers (hydro cleaning+HF processing+hydro cleaning), as compared to the TFTs using the crystalline semiconductor film in their active layers (hydro cleaning+HF processing).

Dispersion in the electrical characteristics of the TFTs can thus be reduced, and the electrical characteristics can be improved, if the TFTs are produced based on crystalline semiconductor films manufactured to have lowered impurity contamination.

[Embodiment Mode 2]

A method of manufacturing a crystalline silicon film in which the height of ridges in the film surface is reduced by performing laser annealing in an inert gas atmosphere, after performing laser annealing by a method similar to that of Embodiment Mode 1, and additionally performing hydrofluoric acid processing, is explained using FIGS. 4A to 4G.

Figure 4A:
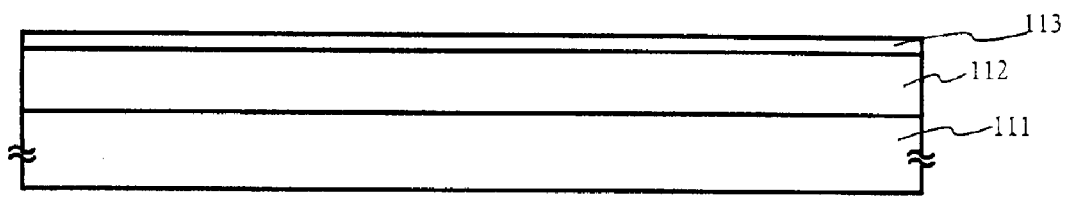
FIGS. 4A to 4G are cross sectional diagrams showing manufacturing processes in accordance with Embodiment Mode 2 and embodiment 4.
Figure 4B:
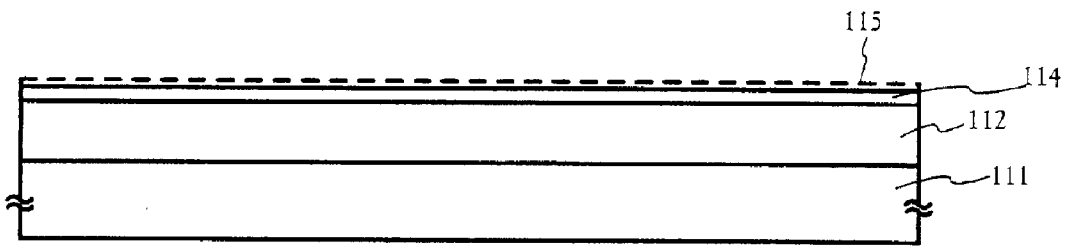
Figure 4C:
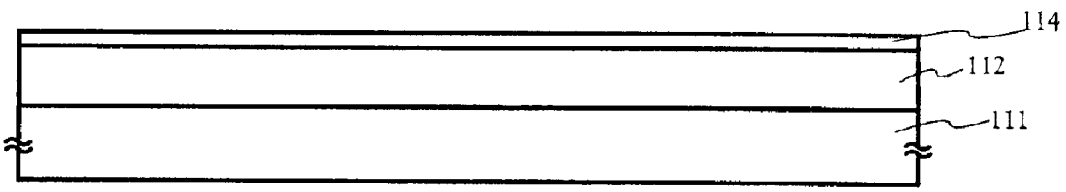
Figure 4D:
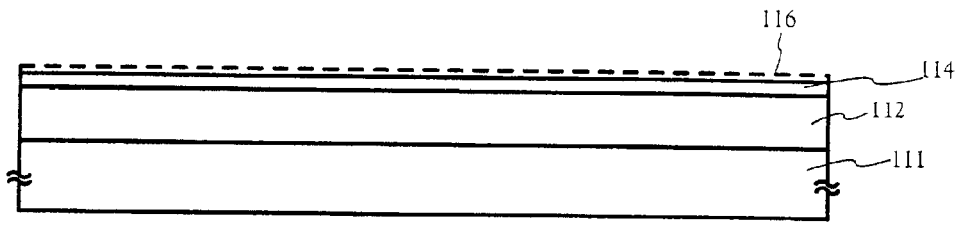

A base insulating film 112 and a semiconductor film 113 are formed on a substrate 111 by a method similar to that of Embodiment Mode 1, a small amount of an element is introduced to the semiconductor film, and heat treatment is performed (FIG. 4A). A crystalline semiconductor film 114 is obtained by the heat treatment. Hydrofluoric acid processing is performed as a preprocess to laser annealing, and the natural oxide film 115 is removed (FIGS. 4B and 4C). Oxidation processing (preferably oxidation processing having an organic substance removal effect) is then performed, forming an oxide film 116 on the semiconductor film 114 (FIG. 4D). A laser beam is then irradiated in an inert gas atmosphere (for example, a nitrogen atmosphere) having an oxygen concentration equal to or less than 20 ppm, performing a first laser anneal (FIG. 4E), and a crystalline semiconductor film 117 is thus obtained (FIG. 4F). Ozone water processing, irradiation of UV light in an oxygen atmosphere, or processing with a sulfuric acid and hydrogen peroxide mixture, may be performed as the oxidation process (FIG. 4G).

Hydrofluoric acid processing is again performed, removing an oxide film, and a laser beam is irradiated in an inert gas atmosphere (for example, a nitrogen atmosphere) having an oxygen concentration equal to or less than 20 ppm to perform a second laser anneal.

A crystalline semiconductor film in which the height of ridges in the film surface is reduced is obtained in accordance with the second laser anneal, while the crystal grain size obtained by the first laser anneal is maintained.

The electrical characteristics of TFTs can be improved if the TFTs are manufactured based upon crystalline semiconductor films, in which the height of ridges in the film surface is reduced, manufactured by the above method.

[Embodiment Mode 3]

Figure 5:
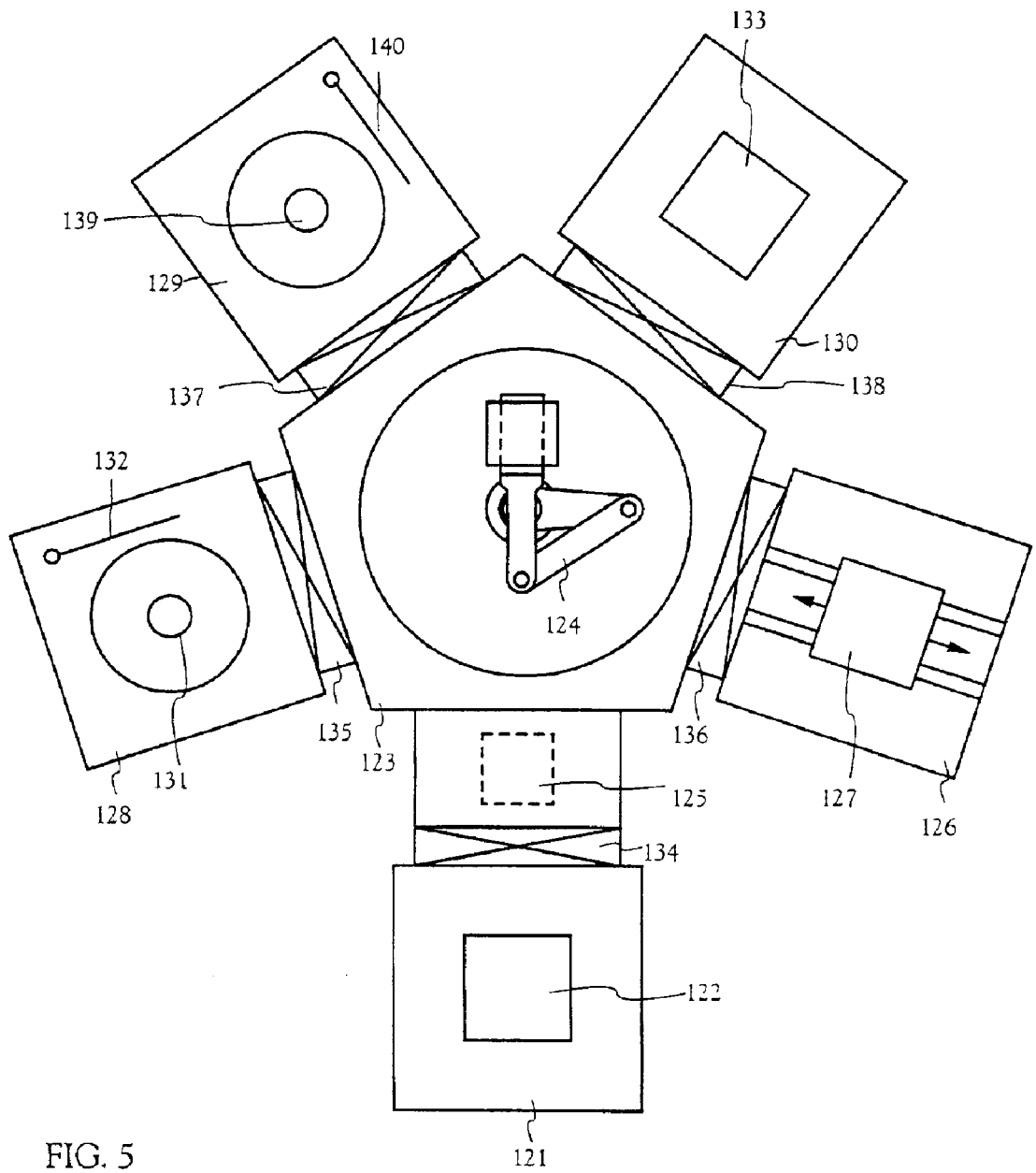
FIG. 5 shows an example of a laser processing apparatus of the present invention.

A laser processing apparatus for consecutive processing with maintaining a substrate in an inert gas atmosphere during a period from the laser annealing preprocess up through laser annealing in Embodiment Modes 1 and 2 is explained using FIG. 5.

Denoted by reference numeral 121 is an entrance and exit chamber for placement and removal of a substrate (sample). Substrates, on which silicon films that are objects to be irradiated by a laser beam, or thin film transistors in a state of undergoing manufacturing processing are formed, are stored therein as contained in a multiple substrate cassette 122. Movement of the cassette 122 accompanying a substrate occurs when placing a substrate into the substrate entrance and exit chamber 121 from the outside and taking out the substrate to the outside.

Reference numeral 123 denotes a conveyor chamber for conveying substrates within the apparatus, and is provided with a robot arm 124 for conveying the substrates one at a time.

Further, reference numeral 125 denotes an alignment means used for positional alignment of the substrate. The alignment means 125 functions to accurately perform positional alignment of the robot arm and the substrates.

A chamber denoted by reference numeral 126 is a chamber for irradiating a laser beam to the substrates. In this chamber a laser beam emitted from a laser irradiation apparatus can be irradiated to substrates, disposed on a stage 127 for substrate placement, through a synthetic quartz window. The stage 127 functions to move one dimensionally, as shown by the arrow.

Figure 3A:
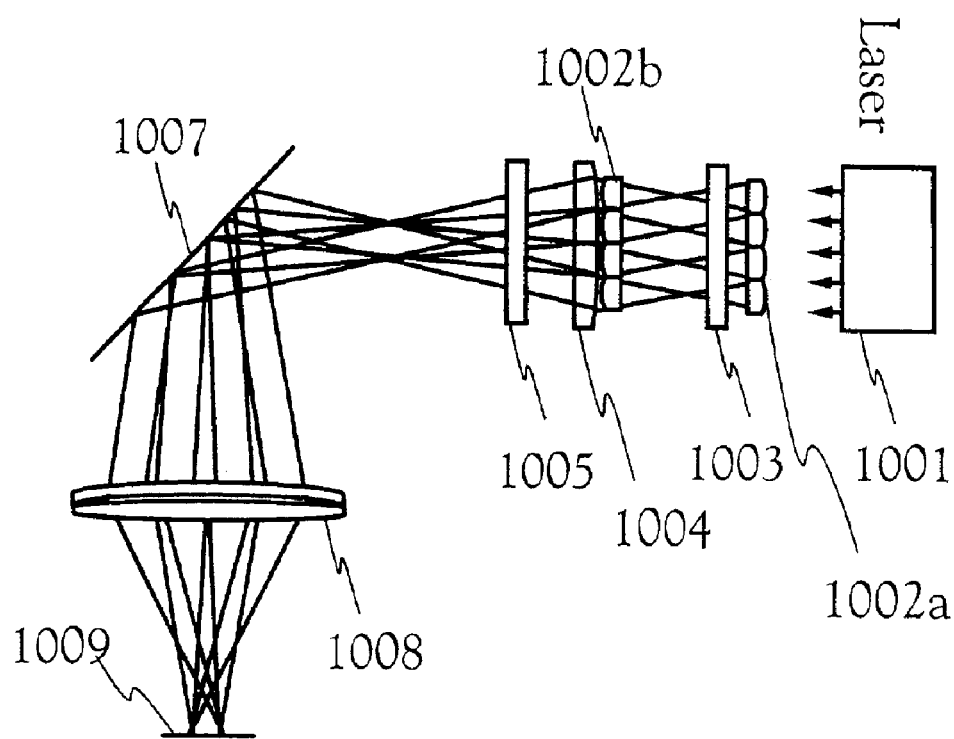
FIGS. 3A and 3B show a side view and a top vies of an optical system for processing a laser beam into a linear beam of the present invention, respectively.
Figure 3B:
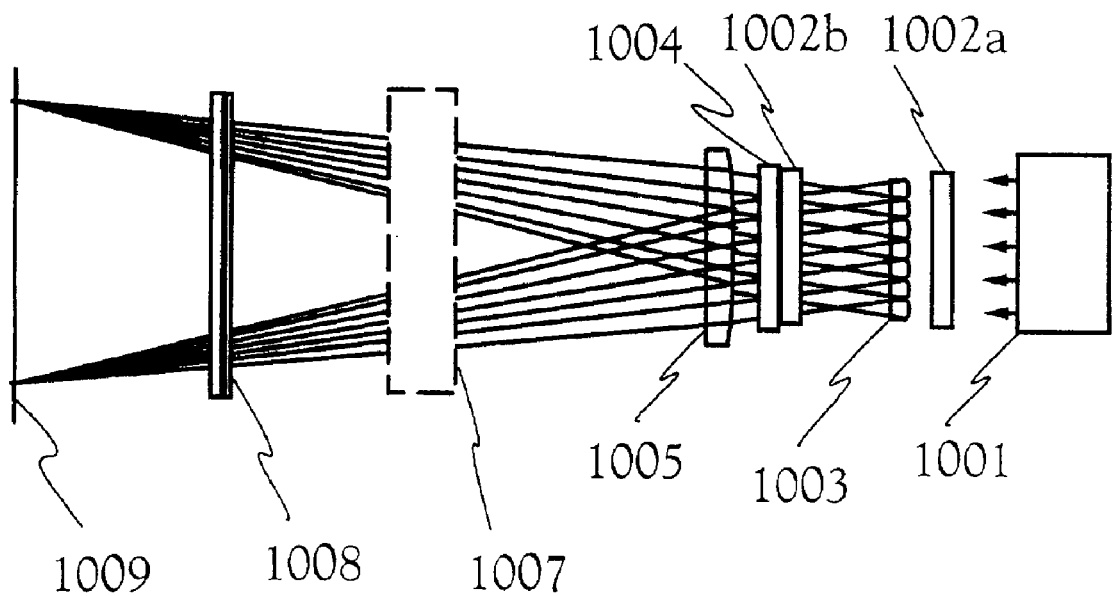

The laser irradiation apparatus functions for oscillating a laser, for example an XeCl excimer laser, and an optical system like that shown in FIGS. 3A and 3B are installed in the laser irradiation apparatus. The laser beam is shaped into a linear shape beam by passing through the optical system shown in FIGS. 3A and 3B.

FIG. 3A (the side view) is explained first. Laser beam emitted from a laser oscillator 1001 is split at a right angle direction to the advancing direction of the laser beam by cylindrical lens arrays 1002a and 1002b. The direction is referred to as a longitudinal direction throughout the present specification. When a mirror is placed along the optical system, the laser beams in the longitudinal direction will curve in the direction of light curved by the mirror. These laser beams in this structure are split into 4 beams. The split laser beams are then converged into 1 beam by a cylindrical lens 1004. Then, the converged laser beam are split again and reflected at a mirror 1007. Thereafter, the split laser beams are again converged into 1 laser beam at an irradiated surface 1009 by a doublet cylindrical lens 1008. A doublet cylindrical lens is a lens that is constructed of 2 pieces of cylindrical lenses. Thus, the energy in the width direction of the linear laser beam is homogenized and the length of the width direction of the linear beam is also determined.

FIG. 3B (the top view) is explained next. Laser beam emitted from the laser oscillator 1001 is split at a right angle direction to the advancing direction of the laser beam and at a right angle direction to the longitudinal direction by a cylindrical lens array 1003. The right angle direction is called a vertical direction throughout the present specification. When a mirror is placed along the optical system, the laser beams in the vertical direction will curve in the direction of light curved by the mirror. The laser beams in this structure is split into 7 beams. Thereafter, the split laser beams are converged into 1 beam at the irradiated surface 1009 by the cylindrical lens 1005. Thus, homogenization of the energy in the longitudinal direction of the linear beam is made and the length of the longitudinal direction is also determined.

Reference numeral 128 denotes an oxide film removal chamber for performing hydrofluoric acid processing on the substrate by using a spinner. A spinner 131 has a chuck function for supporting the substrates, and can be made to rotate at a predetermined rotational speed. Further, the oxide film removal chamber 128 has a plurality of chemical nozzles 132 for discharging hydrofluoric acid and pure water, and spraying the discharge onto the substrates.

Reference numeral 129 denotes an oxide film formation chamber (oxidation processing chamber) for performing oxidation processing on the substrates. A spinner 139 has a chuck function for supporting the substrates, and can be made to rotate at a predetermined rotational speed from 100 to 3000 rpm. Further, the oxide film formation chamber 129 has a plurality of chemical nozzles 140 for discharging ozone water and pure water, and spraying the discharge onto the substrates. A means for organic substance removal and oxide film formation is not limited to the chemical nozzles; a means of irradiating UV light may also be used.

Reference numeral 130 denotes a heat treatment chamber for heating the substrates. A resistance heating means is mounted in a stage 133, and the resistance heating means can heat the substrates to a predetermined temperature.

Each of the chambers has a sealed structure, and can be placed in a reduced pressure state or a high vacuum state by using an evacuation system. Each evacuation system has an independent vacuum pump. Further, a gas supply system is installed in each of the chambers in order to supply necessary gasses (for example, inert gasses). The chambers are equipped with gate valves 134 to 138, thus obtaining a structure in which the airtightness of each chamber is made independent and is increased.

The substrates can thus be held in an inert gas atmosphere having an oxygen concentration equal to or less than 20 ppm during periods between the hydrofluoric acid processing, oxidation processing, and laser annealing steps of Embodiment Mode 1 by using the laser processing apparatus. Dispersion in the electrical characteristics of TFTs is reduced, and the electrical characteristics are improved, if the TFTs are manufactured based on crystalline semiconductor films having reduced impurity contamination that are produced by using this apparatus.

Furthermore, the substrates can thus be held in an inert gas atmosphere having an oxygen concentration equal to or less than 20 ppm during periods between the hydrofluoric acid processing, oxidation processing, laser annealing, oxidation processing, and laser annealing steps of Embodiment Mode 2 by using the laser processing apparatus. Dispersion in the electrical characteristics of TFTs is reduced, and the electrical characteristics are improved, if the TFTs are manufactured based on crystalline semiconductor films in which the height of ridges in the film surface and impurity contamination are reduced and which are produced by using this apparatus.

An additionally detailed explanation of the present invention having the aforementioned structure is given by the embodiments shown below.

[Embodiment 1]

A method of manufacturing a crystalline silicon film, in which impurity contamination is reduced, is explained using FIGS. 2A to 2E. In this method, an amorphous silicon film is used as an amorphous semiconductor film, and laser annealing is performed after a metallic element is introduced to the amorphous silicon film and heat treatment is performed. After a natural oxide film is removed, oxidation processing of the semiconductor film is performed by using ozone water, and then laser annealing is performed.

A 5 inch square Corning #1737 substrate having a thickness of 0.7 mm is prepared as a substrate. As shown in FIG. 2A, the silicon oxynitride film 102 having a thickness of 200 nm is formed on the substrate 101 by using a plasma CVD apparatus, and the amorphous silicon film 103 is formed to have a thickness of 50 nm on the surface of the silicon oxynitride film 102. A solution containing an element for promoting crystallization is then applied on the amorphous silicon film. If a nickel acetate solution is used as the solution, for example, then the nickel acetate solution (concentration of 10 ppm by weight, 5 ml volume) is applied to the entire film surface by spin coating. The substrate is then heat treated at a temperature of 500° C. for one hour in a nitrogen atmosphere, and in addition, at a temperature of 550° C. for four hours in a nitrogen atmosphere. The silicon film 104 having crystallinity is obtained by the heat treatment, as shown in FIG. 2B.

Next, hydrofluoric acid processing (etching processing) is performed as a preprocess for laser annealing. As shown in FIG. 2C, the natural oxide film 105 on the surface of the crystalline silicon film, whose composition and film thickness are uncontrolled, and localized metallic elements are removed by using a 0.5% concentration of hydrofluoric acid by spraying the hydrofluoric acid onto the processing substrate for 70 seconds while the substrate is being rotated. The silicon oxide film 106 is then formed having a thickness on the order of 1 to 2 nm by oxidation processing applying ozone water by spin coating for 20 to 40 seconds at a speed of 500 rpm, as shown in FIG. 2D. Ozone water having an ozone concentration of 6 to 15 mg/l is used. The silicon oxide film 106 covers the surface of the silicon film 104, and is effective in reducing impurity contamination.

Next, a laser beam is irradiated within a nitrogen atmosphere as shown in FIG. 2E by using a Lambda Corp. XeCl excimer laser #L3308 (wavelength 308 nm, pulse width 30 ns), performing laser annealing. The laser oscillator emits a pulse emission laser beam, and possesses the capability of outputting an energy of 500 mJ/pulse. The laser beam size is 10×30 mm at beam output (both the half-widths in the beam profile). The laser beam is processed into a linear shape beam through an optical system like that shown in FIGS. 3A and 3B, and laser annealing is performed using the XeCl excimer laser.

Dispersion in the electrical characteristics of TFTs is reduced, and the electrical characteristics are improved, if the TFTs are manufactured based on the crystalline silicon films having reduced impurity contamination that are produced by the above method.

[Embodiment 2]

A method of manufacturing a crystalline silicon film, in which impurity contamination is reduced, is explained using FIGS. 2A to 2E. In this method, an amorphous silicon film is used as an amorphous semiconductor film, and laser annealing is performed after a metallic element is introduced to the amorphous silicon film and heat treatment is performed. After a natural oxide film is removed, oxidation processing of the semiconductor film is performed by irradiating UV light within an oxygen atmosphere, and then laser annealing is performed.

As shown in FIG. 2A, the silicon oxynitride film 102 and the amorphous silicon film 103 are formed on the substrate 101 by a method similar to that of Embodiment 1, and a solution containing an element for promoting crystallization is applied on the amorphous silicon film 103. Next, heat treatment is performed at a temperature of 500° C. for one hour in a nitrogen atmosphere, and in addition, at a temperature of 550° C. for four hours in a nitrogen atmosphere. The silicon film 104 having crystallinity is obtained by the heat treatment, as shown in FIG. 2B.

Next, the natural oxide film 105 is removed as shown in FIG. 2C by performing hydrofluoric acid processing as a preprocess to laser annealing. UV light is then irradiated in the oxidation atmosphere to the substrate temperature 200° C. in 30 to 120 seconds, and forming the silicon oxide film 106 having a thickness on the order of 1 to 2 nm, as shown in FIG. 2D. The silicon oxide film 106 covers the surface of the silicon film 104, and has an effect of reducing impurity contamination. Next, a laser beam is irradiated within a nitrogen atmosphere by using an XeCl excimer laser and a method similar to that of Embodiment 1, performing laser annealing as shown in FIG. 2E.

Dispersion in the electrical characteristics of TFTs is reduced, and the electrical characteristics are improved, if the TFTs are manufactured based on the crystalline silicon films having reduced impurity contamination that are produced by the above method.

[Embodiment 3]

A method of manufacturing a crystalline silicon film, in which impurity contamination is reduced, is explained using FIGS. 2A to 2E. In this method, an amorphous silicon film is used as an amorphous semiconductor film, and laser annealing is performed after a metallic element is introduced to the amorphous silicon film and heat treatment is performed. After a natural oxide film is removed, oxidation processing of the semiconductor film is performed by hydrofluoric acid, and then laser annealing is performed.

As shown in FIG. 2A, the silicon oxynitride film 102 and the amorphous silicon film 103 are formed on the substrate 101 by a method similar to that of Embodiment 1, and a solution containing an element for promoting crystallization is applied on the amorphous silicon film 103. Next, heat treatment is performed at a temperature of 500° C. for one hour in a nitrogen atmosphere, and in addition, at a temperature of 550° C. for four hours in a nitrogen atmosphere. The silicon film 104 having crystallinity is obtained by the heat treatment, as shown in FIG. 2B.

Next, the natural oxide film 105 on the surface of the crystalline silicon film is removed as shown in FIG. 2C by performing hydrofluoric acid processing as a preprocess to laser annealing. A sulfuric acid and hydrogen peroxide mixture is then applied for 5 to 60 seconds, thereby performing oxidation processing, and forming the silicon oxide film 106 having a thickness on the order of 1 to 2 nm, as shown in FIG. 2D. The silicon oxide film 106 covers the surface of the silicon film 104, and has an effect of reducing impurity contamination. A liquid having a volumetric ratio as follows is used as the mixture of sulfuric acid and hydrogen peroxide, namely $H_2SO_4::H_2O_2::H_2O=95::31::74$. The liquid temperature is on the order of 60 to 80° C. Next, a laser beam is irradiated within a nitrogen atmosphere by using an XeCl excimer laser according to a method similar to that of Embodiment 1, performing laser annealing as shown in FIG. 2E.

Dispersion in the electrical characteristics of TFTs is reduced, and the electrical characteristics are improved, if the TFTs are manufactured based on the crystalline silicon films having reduced impurity contamination that are produced by the above method.

[Embodiment 4]

A method of manufacturing a crystalline silicon film in which the height of ridges in the film surface is reduced, is explained using FIGS. 4A to 4G. In this method, oxidation processing of a semiconductor film is performed, as a laser annealing preprocess, by using ozone water after removing a natural oxide film. In addition, hydrofluoric acid processing is performed, after which laser annealing is performed in a nitrogen atmosphere.

As shown in FIG. 4A, the silicon oxynitride film 112 and the amorphous silicon film 113 are formed on the substrate 111 by a method similar to that of Embodiment 1, and a solution containing an element for promoting crystallization is applied on the amorphous silicon film 113. Next, heat treatment is performed at a temperature of 500° C. for one hour in a nitrogen atmosphere, and in addition, at a temperature of 550° C. for four hours in a nitrogen atmosphere. The silicon film 114 having crystallinity is obtained by the heat treatment, as shown in FIG. 4B.

Next, the natural oxide film 115 on the surface of the silicon film is removed as shown in FIG. 4C by performing hydrofluoric acid processing as a preprocess to laser annealing by a method similar to that of Embodiment 1. Aqueous ozone is then performed, and forming the silicon oxide film 116 as shown in FIG. 2D.

Figure 4E:
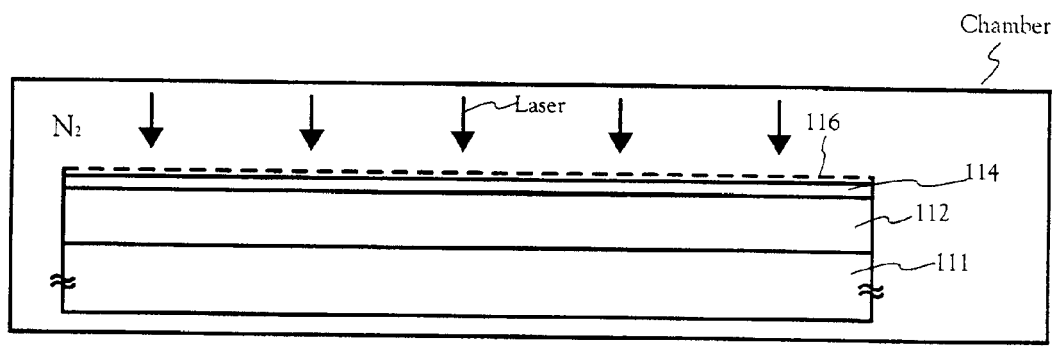
Figure 4F:
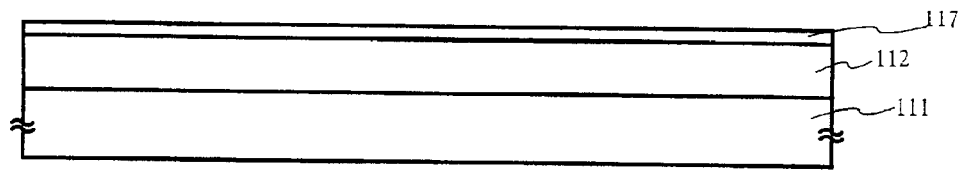
Figure 4G:
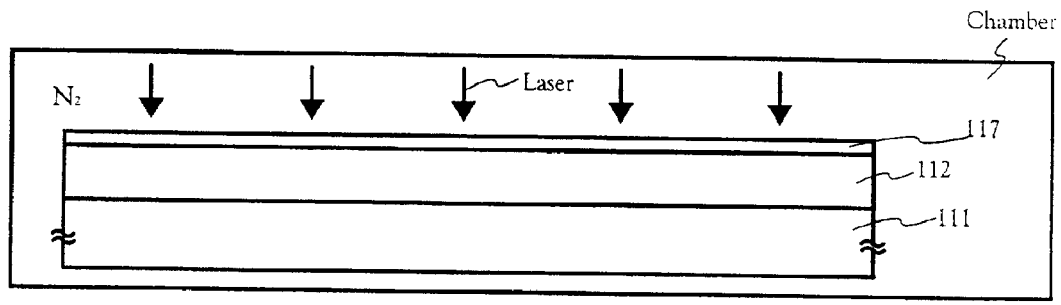

Then, laser beam is irradiated within a nitrogen atmosphere by using an XeCl excimer laser and a method similar to that of Embodiment 1, performing laser annealing as shown in FIG. 4E.

Next, the silicon oxide film is removed by again performing hydrofluoric acid processing, exposing the crystalline silicon film 117 as shown in FIG. 4F. A laser beam is then irradiated within a nitrogen atmosphere containing an oxygen concentration equal to or less than 20 ppm, performing laser annealing as shown in FIG. 4G. The height of ridges on the surface of the silicon film 117 are reduced by the laser annealing.

The electrical characteristics of TFTs can be improved if the TFTs are manufactured based upon crystalline semiconductor films, in which the height of ridges in the film surface is reduced, manufactured by the above method.

[Embodiment 5]

A laser processing apparatus utilized when implementing the present invention disclosed by this specification is shown in Embodiment 5. A case of using ozone water processing as an oxidation processing is explained using FIG. 5. FIG. 5 is an upper surface diagram of a laser processing apparatus.

Denoted by the reference numeral 121 is the entrance and exit chamber for placement and removal of substrates (test pieces). Silicon films that are objects to be irradiated by a laser beam, or thin film transistors in a state of undergoing manufacturing processing, are formed on the substrates. Such substrates are stored as contained in the multiple substrate cassette 122. Movement of the cassette 122 is performed when placing a substrate into the substrate entrance and exit chamber 121 from the outside or removing it.

The reference numeral 123 denotes a conveyor chamber for conveying substrates within the apparatus, and is provided with the robot arm 124 for conveying the substrates one by one at a time.

Further, the reference numeral 125 denotes a alignment means used for positional alignment of the substrate. The alignment means 125 functions in order to accurately perform positional alignment of the robot arm and the substrates.

The chamber denoted by the reference numeral 126 is the chamber for irradiating a laser beam to the substrates. A laser beam irradiated from a laser irradiation apparatus can be irradiated to substrates, disposed on the stage 127 for substrate placement, through a synthetic quartz window. The stage 127 functions so as to move one-dimensionally, as shown by the arrow.

The laser irradiation apparatus functions for oscillating a laser, for example an XeCl excimer laser, and an optical system like that shown in FIGS. 3A and 3B are installed in the laser irradiation apparatus. The laser beam is shaped into a linear shape beam having a width of several mm to several cm, and a length of several tens of cm, by passing through the optical system shown in FIGS. 3A and 3B.

The reference numeral 128 denotes an oxide film removal chamber for performing hydrofluoric acid processing on the substrate by using a spinner. The spinner 131 has a chuck function for supporting the substrates, and can be made to rotate at a predetermined rotational speed from 100 to 3000 rpm. Further, the oxide film removal chamber 128 has the plurality of chemical nozzles 132 for discharging hydrofluoric acid and pure water, and spraying the discharge onto the substrates.

The reference numeral 129 denotes an oxidation processing chamber for performing oxidation processing on the substrates by using ozone water. The spinner 139 has a chuck function for supporting the substrates, and can be made to rotate at a predetermined rotational speed from 100 to 3000 rpm. Further, the oxide film formation chamber 129 has a plurality of chemical nozzles 140 for discharging ozone water and pure water, and spraying the discharge onto the substrates. A means for organic substance removal and oxide film formation is not limited to the chemical nozzles; irradiation of UV light may also be used.

The reference numeral 130 denotes a heat treatment chamber for heating the substrates. A resistance heating means is mounted in a stage 133, and the resistance heating means can heat the substrates to a predetermined temperature.

Each of the chambers has a sealed structure, and can be placed in a reduce pressure state or a high vacuum state by using an evacuation system. Each evacuation system has an independent vacuum pump. Further, a gas supply system is installed in each of the chambers in order to supply necessary gasses (for example, inert gasses). The chambers are equipped with the gate valves 134 to 138, thus taking a structure in which the airtightness of each chamber is made independent and is increased.

Furthermore, for cases in which ozone water is used in oxidation processing, the oxide film removal chamber 128 and the oxidation processing chamber 129 can be combined into one chamber by adding chemical nozzles for discharging and spraying ozone water on the substrates, for example, in the oxide film removal chamber 128 as means for removing organic substances and forming oxide films, thereby reducing the number of chambers, and be capable of increasing the throughput.

[Embodiment 6]

A case of maintaining substrates in a nitrogen atmosphere, having an oxygen concentration equal to or less than 20 ppm, between the natural oxide film removal, semiconductor film oxidation processing and the laser annealing processing when using the laser processing apparatus disclosed in Embodiment 5 is explained using FIGS. 6A to 6E in Embodiment 6. This is employed when removing the natural oxide film by using hydrofluoric acid processing as a preprocess to laser annealing, then performing oxidation processing of the semiconductor film using ozone water, and afterward performing laser annealing.

Figure 6A:
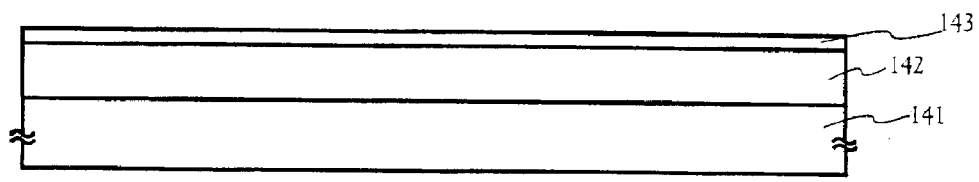
FIGS. 6A to 6E are cross sectional diagrams showing a manufacturing process in accordance with Embodiment 6.

The a silicon oxynitride film 142 and an amorphous silicon film 143 are formed on a substrate 141 by using a method similar to that of Embodiment 1, as shown in FIG. 6A. A solution containing an element for promoting crystallization is then applied to the amorphous silicon film 143. Next, heat treatment is performed on the substrate in a nitrogen atmosphere at 500° C. for 1 hour, and additional heat treatment is performed at 550° C. for 4 hours in a nitrogen atmosphere. A silicon film 144 having crystallinity is obtained in accordance with the heat treatment, as shown in FIG. 6B.

Laser annealing preprocessing and laser annealing are performed next using the laser processing apparatus shown in Embodiment 5. FIG. 5 is a top view of the laser processing apparatus. All gate valves are in a closed state, and a nitrogen atmosphere having an oxygen concentration equal to or less than 20 ppm is maintained in each chamber.

Figure 6B:
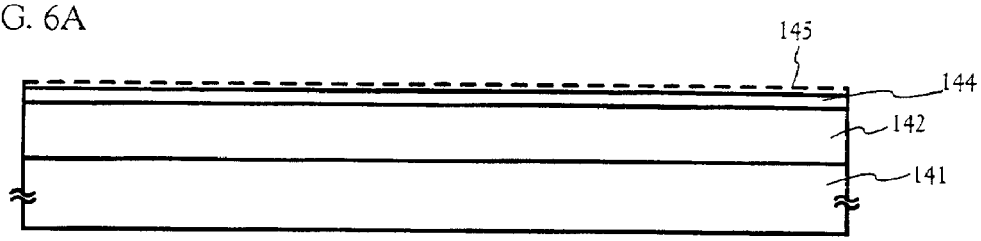

First, the cassette 122 for holding a plurality of substrates in a state of FIG. 6B is stored in the substrate entrance and exit chamber 121. Next, the entrance and exit chamber 121 is given a nitrogen atmosphere having an oxygen concentration equal to or less than 20 ppm.

The gate valve 134 is then opened, and one substrate is removed from the cassette 122 by the robot arm 124. The substrate is moved to the conveyor chamber 123, and the gate valve 134 is closed. In addition, the gate valve 135 is opened and the substrate held by the robot arm 124 is transferred to the oxide film removal chamber 128. The gate valve 135 is then closed.

Figure 6C:
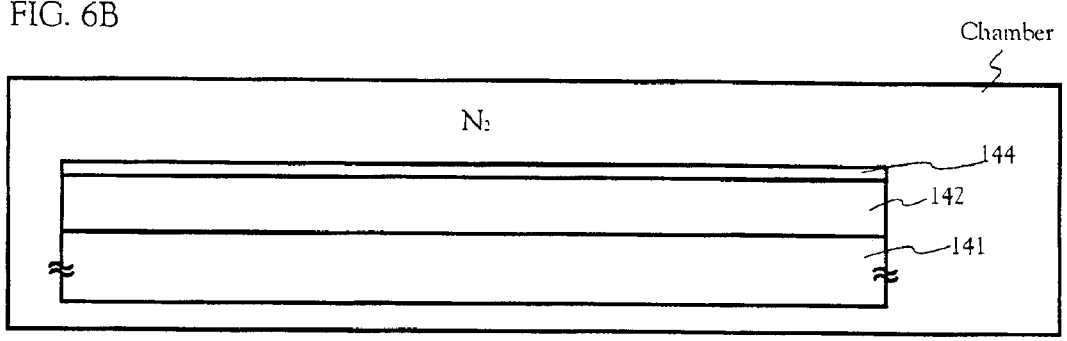

With the substrate maintained in the oxidation film removal chamber 128 in a nitrogen atmosphere having an oxygen concentration equal to or less than 20 ppm, the substrate is rotated at 600 rpm by a spinner and hydrofluoric acid is sprayed onto the substrate, removing a natural oxide film 145 as shown in FIG. 6C. The substrate is then cleaned with pure water, and rotated at 2500 rpm for drying. The gate valve 135 is opened next, the substrate is transferred to the conveyor chamber 123 by the robot arm 124, and the gate valve 135 is closed. The gate valve 137 is then opened, the substrate maintained by the robot arm 124 is moved to the oxidation processing chamber 129, and the gate valve 137 is closed.

Figure 6D:
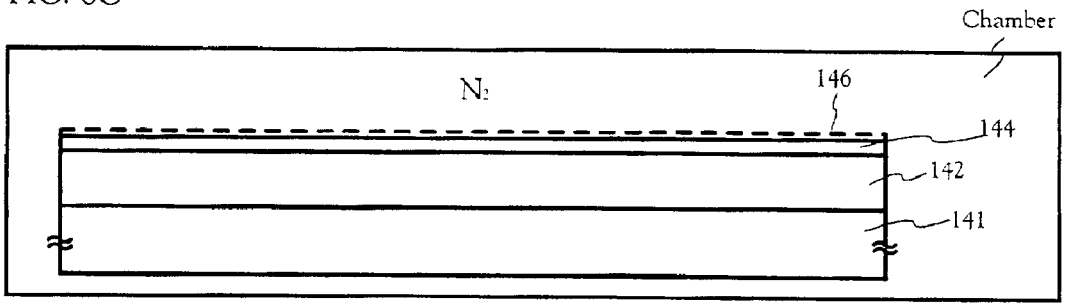

The substrate is rotated at a speed of 500 rpm by a spinner in the oxidation processing chamber 129, in which the substrate is maintained in a nitrogen atmosphere with an oxygen concentration equal to or less than 20 ppm. Ozone water processing is performed for 20 to 40 seconds while the substrate is spinning by using ozone water having an ozone concentration between 6 and 15 mg/l, forming a silicon oxide film 146 having a thickness on the order of 10 to 20 Å as shown in FIG. 6D. The silicon oxide film 146 covers the surface of the silicon film 144 and is effective in lowering impurity contamination.

The gate valve 137 is opened after oxidation processing, the substrate is transferred to the conveyor chamber 123 by the robot arm 123, and the gate valve 137 is closed. Next, the substrate is moved to the heat treatment chamber 130, heat treatment of the substrate is performed by the stage 133 having a substrate heating means, and any moisture remaining on the substrate may he dried. The gate valve 136 is then opened, and the substrate is transferred by the robot arm 124 to the chamber 126 for irradiating a laser beam. The gate valve 136 is then closed.

Figure 6E:
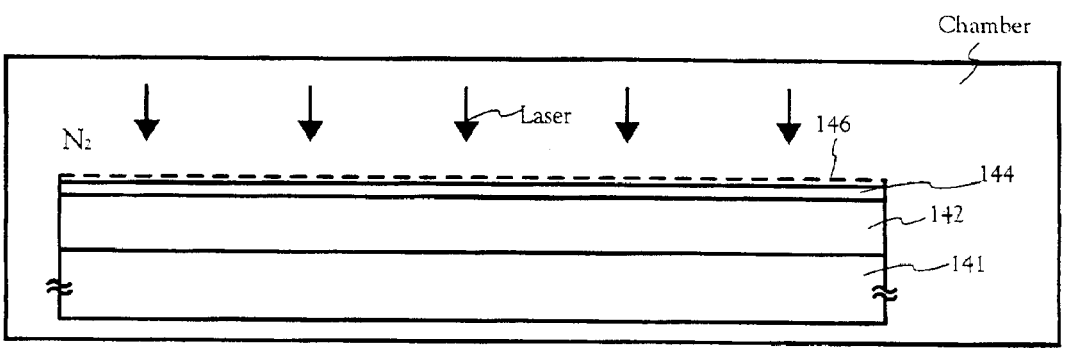

A laser beam having a linear shape is used, and the laser beam is irradiated with respect to a predetermined surface area by moving the substrate stage 127 in the width direction of the linear shape laser beam. In the state of FIG. 6E, the substrate stage 127 is moved so that the laser beam steps from the right edge of the substrate to the left edge in the figure, and the laser beam is irradiated. The speed of motion of the substrate stage 127 is set to 1 mm/sec here.

The gate valve 136 is opened after laser beam irradiation is completed, the substrate is transferred to the conveyor chamber 123 by the robot arm 124, and the gate valve 136 is closed. The gate valve 134 is then opened, the substrate is stored in the cassette 122 within the entrance and exit chamber 121, and the gate valve 134 is closed.

Hydrofluoric acid processing, oxidation processing, and laser beam irradiation can be performed for all of the plurality of substrates stored in the cassette 122 within the entrance and exit chamber 121 by repeating the aforementioned operations. After hydrofluoric acid processing, oxidation processing, and laser beam irradiation are performed on all of the substrates, the stored substrates in the cassette 122 are removed along with the cassette from the substrates entrance and exit chamber 121 and taken to the outside of the apparatus.

Dispersion in the electrical characteristics of TFTs can be reduced, and the electrical characteristics can be improved, if the silicon films thus manufactured are used in active layers of the TFTs.

[Embodiment 7]

A case of maintaining a substrate under a nitrogen atmosphere having an oxygen concentration equal to or less than 20 ppm between natural oxide film removal, semiconductor film oxidation processing, laser annealing, hydrofluoric acid processing, and laser annealing processes when using the laser processing apparatus disclosed in Embodiment 5 is explained in Embodiment 7 using FIGS. 7A to 7G. The substrate is maintained in the nitrogen atmosphere between the following processes: a process of removing a natural oxide film, used as a preprocess to laser annealing; a process of oxidizing the semiconductor film by using ozone water; a process of a laser annealing; a process of a fluoric acid; and a process of laser annealing in a nitrogen atmosphere.

Figure 7A:
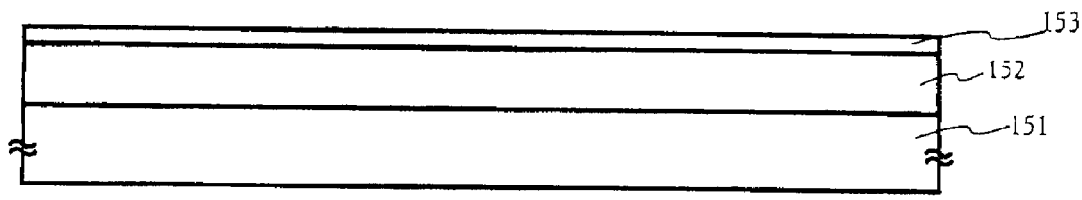
FIGS. 7A to 7G are cross sectional diagrams showing a manufacturing process in accordance with Embodiment 7.

The a silicon oxynitride film 152 and an amorphous silicon film 153 are formed on a substrate 151 by using a method similar to that of Embodiment 1, as shown in FIG. 7A. A solution containing an element for promoting crystallization is then applied to the amorphous silicon film 153. Next, heat treatment is performed on the substrate in a nitrogen atmosphere at 500° C. for 1 hour, and additional heat treatment is performed at 550° C. for 4 hours. A silicon film 154 having crystallinity is obtained in accordance with the heat treatment, as shown in FIG. 7B.

Laser annealing preprocessing and laser annealing are performed next using the laser annealing apparatus shown in Embodiment 5. FIG. 5 is a top view of the laser processing apparatus. All gate valves are in a closed state, and a nitrogen atmosphere having an oxygen concentration equal to or less than 20 ppm is maintained in each chamber.

Figure 7B:
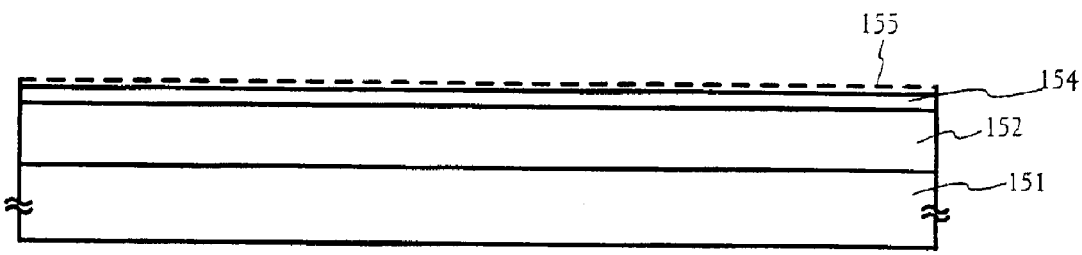

First, the cassette 122 for holding a plurality of substrates shown in FIG. 7B is stored in the substrate entrance and exit chamber 121. Next, the entrance and exit chamber 121 is given a nitrogen atmosphere having an oxygen concentration equal to or less than 20 ppm.

The gate valve 134 is then opened, and one substrate is removed from the cassette 122 by the robot arm 124. The substrate is moved to the conveyor chamber 123, and the gate valve 134 is closed. In addition, the gate valve 135 is opened and the substrate held by the robot arm 124 is transferred to the oxide film removal chamber 128. The gate valve 135 is then closed.

Figure 7C:
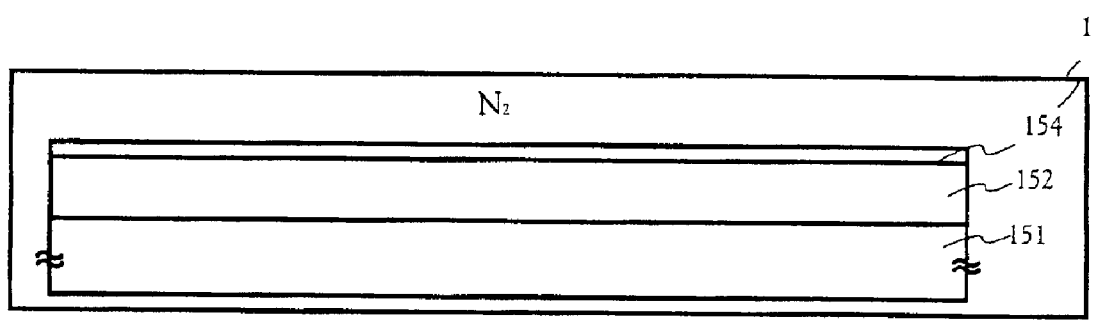

With the substrate maintained in the oxidation film removal chamber 128 in a nitrogen atmosphere having an oxygen concentration equal to or less than 20 ppm, the substrate is rotated at 600 rpm by a spinner and hydrofluoric acid is sprayed onto the substrate, removing a natural oxide film 155 as shown in FIG. 7C. The substrate is then cleaned with pure water, and rotated at 2500 rpm for drying. The gate valve 135 is opened next, the substrate is transferred to the conveyor chamber 123 by the robot arm 124, and the gate valve 135 is closed. The gate valve 137 is then opened, the substrate maintained by the robot arm 124 is moved to the oxidation processing chamber 129, and the gate valve 137 is closed.

Figure 7D:
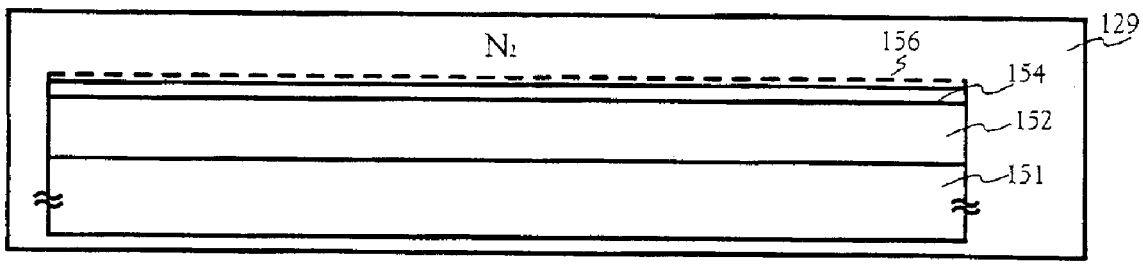

The substrate is rotated at a speed of 500 rpm by a spinner in the oxidation processing chamber 129, in which the substrate is maintained in a nitrogen atmosphere with an oxygen concentration equal to or less than 20 ppm. Ozone water processing is performed for 20 to 40 seconds while the substrate is spinning by using ozone water having an ozone concentration between 6 and 15 mg/l, forming a silicon oxide film 156 having a thickness on the order of 10 to 20 Å as shown in FIG. 7D. The silicon oxide film 156 covers the surface of the silicon film 154 and is effective in lowering impurity contamination.

The gate valve 137 is opened after oxidation processing, the substrate is transferred to the conveyor chamber 123 by the robot arm 123, and the gate valve 137 is closed. Next, the substrate is moved to the heat treatment chamber 130, and heat treatment of the substrate is performed by the stage 133 having heating means, drying any moisture remaining on the substrate. The gate valve 136 is then opened, and the substrate is transferred by the robot arm 124 to the chamber 126 for irradiating a laser beam. The gate valve 136 is then closed.

Figure 7E:
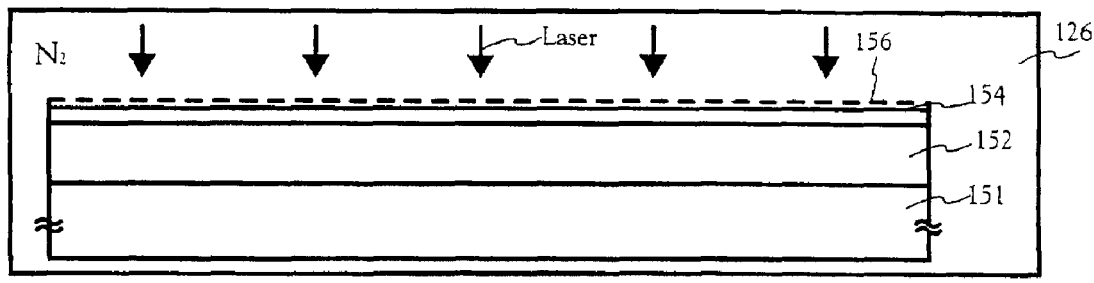

A laser bear having a linear shape is used, and the laser beam is irradiated with respect to a predetermined surface area by moving the substrate stage 127 in the width direction of the linear shape laser beam. In the state of FIG. 7E, the substrate stage 127 is moved so that the laser beam steps from the right edge of the substrate to the left edge in the figure, and the laser beam is irradiated. The speed of motion of the substrate stage 127 is set to 1 mm/sec here.

The gate valve 136 is opened after laser beam irradiation is complete, the substrate is transferred to the conveyor chamber 123 by the robot arm 124, and the gate valve 136 is closed. In addition, the gate valve 135 is opened and the substrate held by the robot arm 124 is transferred to the oxide film removal chamber 128. The gate valve 135 is then closed.

Figure 7F:
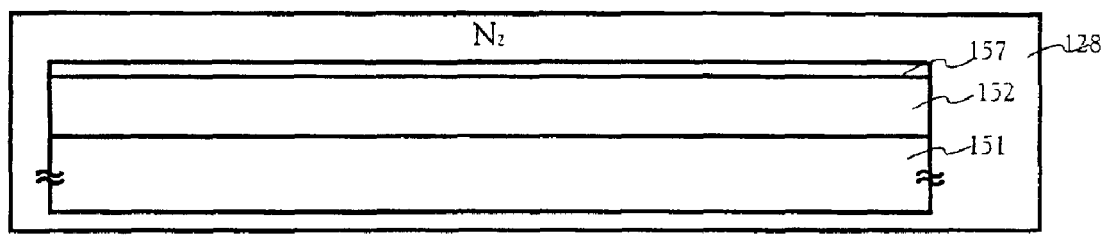

Hydrofluoric acid processing is performed again in the oxide film removal chamber 128 with the substrate maintained in a nitrogen atmosphere having an oxygen concentration equal to or less than 20 ppm, removing a silicon oxide film and exposing a crystalline silicon film 157 as shown in FIG. 7F. The gate valve 135 is opened next, the substrate is transferred to the conveyor chamber 123 by the robot arm 124, and the gate valve 135 is closed. The substrate is then moved to the heat treatment chamber 130, and heated by the stage 133 having a substrate heating means, and any moisture remaining on the substrate may be dried. The gate valve 136 is then opened, the substrate is transferred by the robot arm 124 to the chamber 126 for irradiating a laser beam, and the gate valve 136 is closed.

Figure 7G:
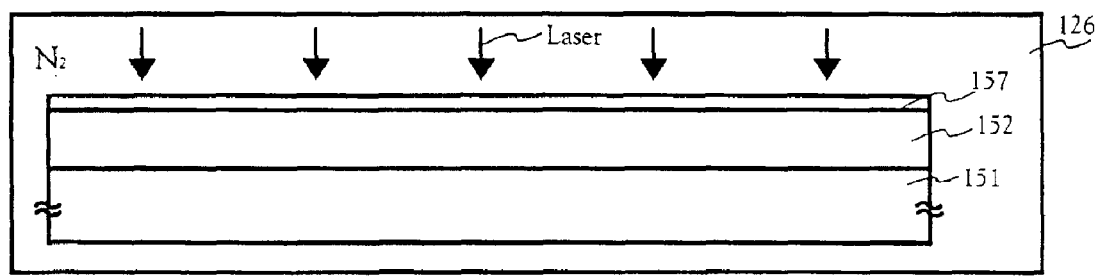

In the laser chamber 126, in the state of FIG. 7G, the substrate stage 127 is moved so that the laser beam steps from the right edge of the substrate to the left edge in the figure, and the laser beam is irradiated. The speed of motion of the substrate stage 127 is set to 1 mm/sec here.

The gate valve 136 is opened after laser beam irradiation is complete, the substrate is transferred to the conveyor chamber 123 by the robot arm 124, and the gate valve 136 is closed. In addition, the gate valve 134 is opened and the substrate is stored in the cassette 122 within the entrance and exit chamber 121. The gate valve 134 is then closed.

Hydrofluoric acid processing, oxidation processing, and laser beam irradiation, and hydrofluoric acid processing and laser beam irradiation can be performed for all of the plurality of substrates stored in the cassette 122 within the entrance and exit chamber 121 by repeating the aforementioned operations. After hydrofluoric acid processing, oxidation processing, and laser beam irradiation, and hydrofluoric acid processing and laser beam irradiation are performed on all of the substrates, the stored substrates in the cassette 122 are removed along with the cassette from the substrates entrance and exit chamber 121 and taken to the outside of the apparatus.

Dispersion in the electrical characteristics of TFTs can be reduced, and the electrical characteristics can be improved, if the silicon films manufactured as above are used in active layers of the TFTs.

[Embodiment 8]

A method of manufacturing an active matrix substrate is explained in Embodiment 8 using FIGS. 8A to 11. For convenience, a substrate on which a CMOS circuit, a driver circuit, and a pixel portion having pixel TFTs and storage capacitors are all formed on the same substrate, is referred to as an active matrix substrate in this specification.

First, as shown in FIG. 8A, a substrate 350 made from glass such as barium borosilicate glass or aluminum borosilicate glass, typically Corning Corp. #7059 glass or #1737 glass, is used in Embodiment 8. Note that quartz substrates, silicon substrates, and metallic substrate and stainless steel substrates on whose surface an insulating film is formed, may also be used as the substrate 350. Further, a plastic substrate having a heat resistance capable of withstanding the process temperatures of Embodiment 8 may also be used.

A base film 351 made from an insulating film such as a silicon oxide film, a silicon nitride film, or a silicon oxynitride film is then formed on the substrate 350. A two layer structure is used as the base film 351 in Embodiment 8, but a single layer of an insulating film, or a structure in which more than two layers are laminated together may also be used. A silicon oxynitride film 351a formed by plasma CVD using $SiH_4$, $NH_3$, and $N_2O$ as reaction gasses is formed having, a thickness of 10 to 200 nm (preferably from 50 to 100 nm) as a first layer of the base film 351. The silicon oxynitride film 351a (composition ratio: Si=32%, O=27%, N=24%, H=17%) is formed having a film thickness of 50 nm in Embodiment 8. Next, a silicon oxynitride film 351b formed by plasma CVD using $SiH_4$ and $N_2O$ as reaction gasses is formed having a thickness of 50 to 200 nm (preferably from 100 to 150 nm) as a second layer of the base film 351. The silicon oxynitride film 351b (composition ratio: Si=32%, O=59%, N=7%, H=2%) is formed having a film thickness of 100 nm in Embodiment 8.

A semiconductor film 352 is formed next on the base film. The semiconductor film 352 is formed by a known means (such as sputtering, LPCVD, or plasma CVD) from a semiconductor film having an amorphous structure and a thickness of 25 to 80 nm (preferably from 30 to 60 nm). Amorphous semiconductor films, microcrystalline semiconductor films, and crystalline semiconductor films may be used as the semiconductor film 352. A thick amorphous silicon film having a thickness of 55 nm is formed using plasma CVD in Embodiment 8.

A small amount of an element such as nickel, palladium, or lead is then introduced to the amorphous semiconductor film. Plasma processing, evaporation, ion injection, sputtering, liquid application and other methods may be utilized for the introduction method. A crystalline semiconductor film having good characteristics can be obtained if the amorphous semiconductor is placed, for example, for 4 hours in a nitrogen atmosphere at 550° C. after the element is added. Conditions such as the optimal heat treatment temperature and heating time for crystallization are determined by the introduction amount of the elements and the state of the amorphous semiconductor film. A solution containing nickel is maintained on the amorphous silicon film in Embodiment 8, and after performing dehydrogenation of the amorphous silicon film (at 500° C. for one hour), thermal crystallization is performed (at 550° C. for 4 hours), forming a crystalline silicon film.

In addition, a crystalline semiconductor film obtained by a laser crystallization method in which the laser annealing preprocess and the laser annealing process of the present invention are applied may be patterned into a predetermined shape, forming semiconductor layers 402 to 406.

A laser such as a pulse emission type or continuous emission type excimer laser, a YAG laser, a $YVO_4$ laser, YLF laser, $YAlC_3$ laser, glass laser, ruby laser, Ti:Sapphire laser, or the like can be used as a laser light source used in the laser crystallization method. A method of condensing laser light emitted from a laser emission device into a linear shape by an optical system and then irradiating the light to the semiconductor film may be employed when these types of lasers are used. The crystallization conditions may be suitably selected by the operator, but the pulse emission frequency is set to 30 Hz, and the laser energy density is set form 100 to 700 mJ/cm$^2$ (typically between 200 and 300 mJ/cm$^2$) when using the excimer laser. Further, the second harmonic is utilized when using the YAG laser, the pulse emission frequency is set from 1 to 300 Hz, and the laser energy density may be set from 300 to 1000 mJ/cm$^2$ (typically between 350 and 500 mJ/cm$^2$). The laser light which has been condensed into a linear shape with a width of 100 to 1000 μm, for example 400 μm, is then irradiated over the entire surface of the substrate. This is performed with an overlap ratio of 50 to 98% for the linear shape laser light.

In Embodiment 8, hydrofluoric acid processing (etching processing) is performed as a preprocess to laser annealing by a method similar to that of Embodiment 1, removing a natural oxide film whose composition and film thickness are uncontrolled, and removing localized metallic elements. Ozone water processing is then performed for 20 to 40 seconds using ozone water having an ozone concentration between 6 and 15 mg/l while the substrate is spun at a speed of 500 rpm using a spin coater. A silicon oxide film having a thickness on the order of 10 to 20 Å is formed.

Next, a laser beam is irradiated within a nitrogen atmosphere by using a Lambda Corp. XeCl excimer laser #L3308 (wavelength 308 nm, pulse width 30 ns) according to a method similar to that of embodiment 1, performing laser annealing. The laser oscillator emits a pulse emission laser beam, and possesses the capability of outputting an energy of 500 mJ/pulse. The laser beam size is 10×30 mm at beam output (both half-widths in the beam profile). The laser beam is processed into a linear shape beam through an optical system like that shown in FIGS. 3A and 3B, and laser annealing is performed using the XeCl excimer laser.

The crystal silicon film is formed into a semiconductor layers 402 to 406 by patterning treatment using the photolithography.

Besides, after the semiconductor layers 402 to 406 have been formed, they may well be doped with a slight amount of impurity element (boron or phosphorus) in order to control the threshold voltages of TFTs.

Subsequently, a gate insulating film 407, which covers the semiconductor layers 402 to 406, is formed. The gate insulating film 407 is formed of an insulating film containing silicon, at a thickness of 40 nm to 150 nm by employing plasma CVD or sputtering. In an example, the gate insulating film 407 was formed of a silicon oxynitride film (at a composition ratio of Si=32%, O=59%, N=7% and H=2%) at a thickness of 110 nm by the plasma CVD. Of course, the gate insulating film 407 is not restricted to the silicon oxynitride film, but another insulating film containing silicon may well be employed as a single layer or lamination layer structure.

Besides, in case of employing a silicon oxide film, it can be formed by the plasma CVD in such a way that TEOS (Tetraethyl Orthosilicate) and $O_2$ are mixed, and that electric discharge is induced under the conditions of a reaction pressure of 40 Pa, a substrate temperature of 300° C. to 400° C. and a radio-frequency (13.56 MHz) power density of 0.5 to 0.8 W/cm$^2$. The silicon oxide film thus prepared is thereafter subjected to thermal annealing at 400° C. to 500° C., whereby characteristics favorable as the gate insulating film can be attained.

Subsequently, a first conductive film 408 having a thickness of 20 nm to 100 nm, and a second conductive film 409 having a thickness of 100 nm to 400 nm are stacked and formed on the gate insulating film 407 (FIG. 8B). In this embodiment, the first conductive film 408 made of a TaN film having a thickness of 30 nm, and the second conductive film 409 made of a W film having a thickness of 370 nm were stacked and formed. The TaN film was formed by sputtering which employed a target of Ta and which was performed in an atmosphere containing nitrogen. On the other hand, the W film was formed by sputtering which employed a target of W. Alternatively, the W film can be formed by thermal CVD which employs tungsten hexafluoride ($WF_6$). Anyway, the W film needs to be lowered in resistivity for use as gate electrodes, and it should desirably have its resistivity set at 20 μΩcm or less. The W film can have its resistivity lowered by enlarging crystal grains, but it has its crystallization hampered to turn into a high resistivity, in a case where impurity elements such as oxygen are contained in large amounts in this W film. In the embodiment, therefore, the W film was formed by the sputtering which employed a W target of high purity (at a purity of 99.9999%) and which took sufficient care that impurities did not mix from within a gaseous phase during the formation of the film. Thus, the W film exhibiting a resistivity of 9 to 20 μΩcm could be realized.

By the way, although the first conductive film 408 and the second conductive film 409 were respectively made of TaN and W in the embodiment, they are not especially restrictive, but both the conductive films may well be formed of an element which is selected from the group consisting of Ta, W, Ti, Mo, Al, Cu, Cr and Nd, or an alloy material or compound material which contains the element as its main component. Alternatively, it is allowed to employ a semiconductor film which is typified by a crystalline silicon film doped with an impurity element such as phosphorus. It is also allowed to employ an AgPdCu alloy. It is further allowed to employ a combination in which the first conductive film is formed of a tantalum (Ta) film, while the second conductive film is formed of a W film; a combination in which the first conductive film is formed of a titanium nitride (TiN) film, while the second conductive film is formed of a W film; a combination in which the first conductive film is formed of a tantalum nitride (TaN) film, while the second conductive film is formed of an Al film; or a combination in which the first conductive film is formed of a tantalum nitride (TaN) film, while the second conductive film is formed of a Cu film.

Subsequently, masks 410 to 414 made of a resist are formed by photolithography, and a first etching process for forming the electrodes and wiring lines is performed. The first etching process is carried out under first and second etching conditions. (FIG. 8C) In this embodiment, as the first etching conditions, ICP (Inductively Coupled Plasma) etching was employed, $CF_4$, $Cl_2$ and $O_2$ were used as etching gases, the ratio of the flow rates of the respective gases was set at 25:25:10 (sccm), and a plasma was generated by feeding RF (13.56 MHz) power of 500 W to a coiled electrode under a pressure of 1 Pa. Used here was a dry etching apparatus utilizing ICP (Model E645-□ICP) produced by Matsushita Electric Industrial Co., Ltd. RF (13.56 MHz) power of 150 W was also fed to a substrate side (sample stage), whereby a negative self-bias voltage was, in effect, applied. Owing to the first etching conditions, the W film is etched to bring the end parts of first conductive layers into a tapered shape.

Thereafter, the first etching conditions were switched to the second etching conditions without removing the masks 410 to 415 made of the resist. More specifically, $CF_4$ and $Cl_2$ were used as etching gases, the ratio of the flow rates of the respective gases was set at 30:30 (sccm), and a plasma was generated by feeding RF (13.56 MHz) power of 500 W to the coiled electrode under a pressure of 1 Pa, whereby etching was carried out for about 30 seconds. RF (13.56 MHz) power of 20 W was also fed to the substrate side (sample stage), whereby a negative self-bias voltage was, in effect, applied. Both the W film and the TaN film are etched substantially equally under the second etching conditions in which the gases $CF_4$ and $Cl_2$ are mixed. By the way, etching time periods may be increased at a rate of about 10% to 20% in order to etch without leaving any residue on the gate insulating film.

In the first etching process, when the masks made of the resist are appropriately shaped, the end parts of the first conductive layers and second conductive layers are tapered by the effects of the bias voltages applied to the substrate side. The angle of each tapered part becomes 15 to 45 degrees. In this way, conductive layers 417 to 422 of the first shape as consist of the first conductive layers and the second conductive layers (first conductive layers 417*a* to 422*a*, and second conductive layers 417*b* to 422*b*) are formed by the first etching process. Incidentally, 416 is a gate insulating film whose regions not covered with the conductive layers 417 to 422 of the first shape have been etched and thinned about 20 nm to 50 nm.

Subsequently, a second etching process is performed without removing the masks made of the resist (FIG. 8D). Here, the W film is selectively etched by employing $CF_4$, $Cl_2$ and $O_2$ as etching gases. On this occasion, second conductive layers 428*b* to 433*b* are formed by the second etching process. On the other hand, the first conductive layers 417*a* to 422*a* are hardly etched (428*a* to 433*a*), so that conductive layers 428 to 433 of second shape are formed.

Further, a first doping process is performed without removing the masks made of the resist, thereby to dope the semiconductor layers with an impurity element which bestows the n-type. The doping process may be carried out by ion doping or ion implantation. The conditions of the ion doping are set at a dose of $1\times10^{13}$ to $5\times10^{14}/cm^2$ and an acceleration voltage of 40 to 80 keV. In this embodiment, the dose was $1.5\times10^{13}/cm^2$, and the acceleration voltage was 60 keV. An element belonging to Group-15 of the periodic table, typically phosphorus (P) or arsenic (As), is employed as the impurity element for bestowing the n-type, and the element phosphorus (P) was employed here. In this case, the conductive layers 428 to 433 serve as masks against the n-type impurity element, and first impurity regions 423 to 427 are formed in self-alignment manner. The first impurity regions 423 to 427 are doped with the n-type impurity element in a concentration range of $1\times10^{18}$ to $1\times10^{20}/cm^3$.

The masks made of the resist are removed, and masks 434*a* to 434*c* made of a resist are formed anew so as to perform a second doping process. In this case, acceleration voltage is higher than that of the first doping process. The ion doping process is set at a dose of $1\times10^{13}$ to $1\times10^{15}/cm^2$, and an acceleration voltage of 60 to 120 keV. In the doping process, using the conductive layers 428*b* to 432*b* of the second shape as masks against an impurity element, the impurity element is also introduced into those parts of the semiconductor layers which lie below the first conductive layers. The state shown in FIG. 9A is obtained by third doping process, which set a lower dose than that of the second doping process. The ion doping process is set at a dose of $1\times10^{15}$ to $1\times10^{17}/cm^2$, and an acceleration voltage of 50 to 100 keV. By the second doping process and the third doping process, the low concentration impurity regions 436, 442 and 448 overlapped with the first conductive layer are doped with the n-type impurity element in a concentration range of $1\times10^{15}$ to $5\times10^{19}/cm^3$, and the high concentration impurity regions 435, 438, 441, 444 and 447 are doped with the n-type impurity element in a concentration range of $1\times10^{19}$ to $5\times10^{21}/cm^3$.

Needless to say, the low concentration impurity region and the high concentration impurity region, which was formed by the second doping process and third doping process can be formed by once doping process, if suitable acceleration voltage is selected.

Subsequently, the masks made of resist are removed, and masks 450*a* to 450*c* made of a resist are formed anew so as to perform a fourth doping process. Owing to the fourth doping process, impurity regions 451, 453 to 455, 457, 459 and 460 doped with an impurity element bestowing the opposite conductivity type to one conductivity type stated before is formed in the semiconductor layer which becomes the active layer of the p-channel TFT. Here, the impurity regions are formed in self-alignment manner in such a way that the impurity element bestowing the p-type is introduced by employing the second conductive layer 428*a* to 432*a* as a mask against the impurity element. In this embodiment, the impurity regions 451, 453 to 455, 457, 459 and 460 were formed by ion doping which employed diborane ($B_2H_6$) (FIG. 9B). During the fourth doping process, the semiconductor layer for forming the n-channel TFTs are covered with the resist masks 450*a* to 450*c*. The impurity regions 438 and 439 have been doped with phosphorus at concentrations different from one another by the first to third doping processes. In this regard, the doping processes are performed so that, in any of the regions, the concentration of the impurity element bestowing the p-type may become $1\times10^{19}$ to $5\times10^{21}/cm^3$. Accordingly, the impurity regions pose no problem in functioning as the source region and drain region of the p-channel TFT.

The impurity regions are formed in the respective semiconductor layers by the steps thus far described.

Subsequently, the masks 450a to 450c made of the resist are removed, and a first interlayer insulating film 461 is formed. The first interlayer insulating film 461 is formed of an insulating film containing silicon, at a thickness of 100 to 200 nm by employing plasma CVD or sputtering. In this embodiment, the first interlayer insulating film 461 was formed of a silicon oxynitride film at a thickness of 150 nm by the plasma CVD. Of course, the first interlayer insulating film 461 is not limited to the silicon oxynitride film, but another insulating film containing silicon may well be employed as a single layer or lamination layer structure.

Subsequently, the step of activating the impurity elements with which the respective semiconductor layers are doped is performed as shown in FIG. 9C. The activating process is performed by thermal annealing which employs an annealing furnace. The thermal annealing may be carried out at a temperature of 400° C. to 700° C., typically 500° C. to 550° C., in a nitrogen atmosphere whose oxygen concentration is at most 1 ppm, preferably at most 0.1 ppm. In this embodiment, the activation was done by a heat treatment at 550° C. for 4 hours. Incidentally, laser annealing or rapid thermal annealing (RTA) is applicable alternatively to the thermal annealing.

By the way, in this embodiment, simultaneously with the activating process, the element nickel having been used as the catalyst at the crystallizing step crystallizes the impurity regions 435, 438, 441, 444 and 447 which contain the element phosphorus at the high concentrations. Therefore, the metal element is gettered in these impurity regions, and the nickel concentrations of the semiconductor layers to serve chiefly as the channel forming regions of the TFTs are lowered. The TFTs including the channel forming regions thus fabricated have low OFF currents and exhibit high field-effect mobilities based on good crystallinity, so that they achieve favorable characteristics.

Besides, the heat treatment may well be performed before the formation of the first interlayer insulating film. However, in a case where the material of wiring lines employed is less resistant to heat, the activating process should preferably be performed after the formation of the interlayer insulating film (an insulating film whose principal component is silicon, for example, a silicon nitride film) in order to protect the wiring lines etc. as in this embodiment.

Further, a heat treatment is performed at 300° C. to 550° C. for 1 to 12 hours as the step of hydrogenating the semiconductor layers. This step is the processing step in which dangling bonds existent in the semiconductor layers are terminated with hydrogen contained in the first interlayer insulating film 461. Plasma hydrogenation (which employs hydrogen excited by a plasma) or a heat treatment was carried out at 300 to 450° C. for 1 to 12 hour in a nitrogen atmosphere containing about 3 to 100% of hydrogen may well be performed as another expedient for the hydrogenation.

Besides, in case of employing the laser annealing for the activating process, the above hydrogenation should desirably be followed by irradiation with a laser beam by an excimer laser, a YAG laser or the like.

Subsequently, the first interlayer insulating film 461 is overlaid with a second interlayer insulating film 462 which is made of an inorganic insulating material or an organic insulating material. In this embodiment, an acrylic resin film having a thickness of 1.6 µm was formed, it had a viscosity of 10 cp to 1000 cp, preferably 40 cp to 200 cp. In addition, the film whose surface is to be leveled as the second interlayer insulating film 462 may also be used.

Figure 10:
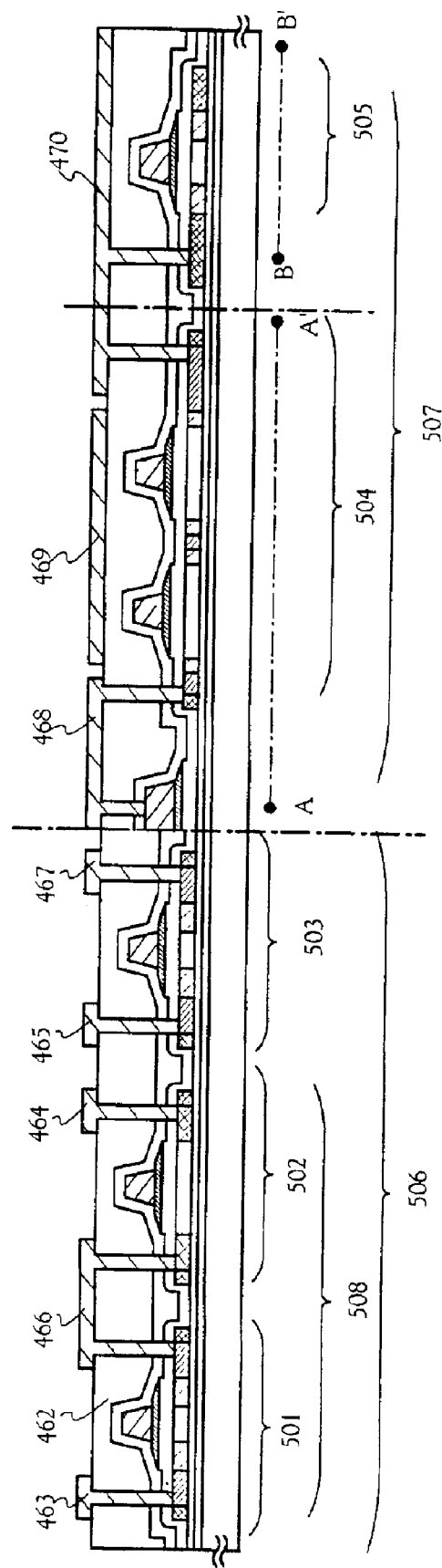
FIG. 10 is a cross sectional diagram showing the process of manufacturing a pixel TFT and driver circuit TFTs of Embodiment 8.

Further, wiring lines 463 to 467 which are electrically connected with the respectively corresponding impurity regions are formed in a driver circuit 506. Incidentally, these wiring lines are formed by patterning a lamination layer film which consists of a Ti film having a thickness of 50 nm, and an alloy film (of Al—Ti alloy) having a thickness of 500 nm. (FIG. 10)

In the pixel portion 507, the pixel electrode 470, a gate wiring line 469 and a connection electrode 468 are formed. Owing to the connection electrode 468, the source wiring line (the lamination layer of 443a and 443b) is electrically connected with the pixel TFT. Besides, the gate wiring line 469 is electrically connected with the gate electrode of the pixel TFT 504. Also, the pixel electrode 470 is electrically connected with the drain region of the pixel TFT, and with the semiconductor layer 406 which functions as one electrode constituting the storage capacitor. The pixel electrode 470 should desirably be formed of a material of excellent reflectivity, for example, a film whose principal component is Al or Ag, or a lamination film which consists of such films. Further, a transparent conductive film such as ITO can be used as the pixel electrode.

In the above way, it is possible to form on the identical substrate the driver circuit 506 which includes a CMOS circuit 508 consisting of the n-channel TFT 501 and the p-channel TFT 502, and the n-channel TFT 503, and the pixel unit 507 which includes the pixel TFT 504 and the storage capacitor 505. Thus, the active matrix substrate is finished up.

The n-channel TFT 501 of the driver circuit 506 includes the channel forming region 437, the low concentration impurity regions 436 (GOLD regions) which are overlapped by a first conductive layer 428a forming a part of the gate electrode, the high concentration impurity regions 452, which function as the source region and drain region, and the impurity region 451, in which an n-type and a p-type impurity element are introduced. The p-channel TFT 502 which forms the CMOS circuit 508 by being connected with the n-channel TFT 501 through the electrode 466, includes the channel forming region 440, the high concentration impurity regions 454 which function as the source region and drain region and the impurity regions 453 and 454 in which the n-type and the p-type impurity element are introduced. Besides, the n-channel TFT 503 includes the channel forming region 443, the low concentration impurity regions 442 (GOLD regions) which are overlapped by a first conductive layer 430a forming part of the gate electrode, the high concentration impurity regions 456 which function as the source region and drain region and the impurity region 455 in which the n-type and the p-type impurity element are introduced.

The pixel TFT 504 of the pixel portion includes the channel forming region 446, the low concentration impurity regions 445 (LDD regions) which are formed outside the gate electrode, the high concentration impurity region 458 which function as the source region and drain region, and the impurity region 457 in which the n-type and the p-type impurity element are introduced. Besides, the storage capacitor 505 is formed of the electrode (a lamination layer of 432a and 432b) and a semiconductor layer with the insulating film 416 utilized as the dielectric.

Besides, in the pixel structure of this embodiment, the end part of each pixel electrode is arranged and formed so as to overlie the source wiring line, in order that the gaps among the pixel electrodes may be shielded from light without employing a black matrix.

Figure 11:
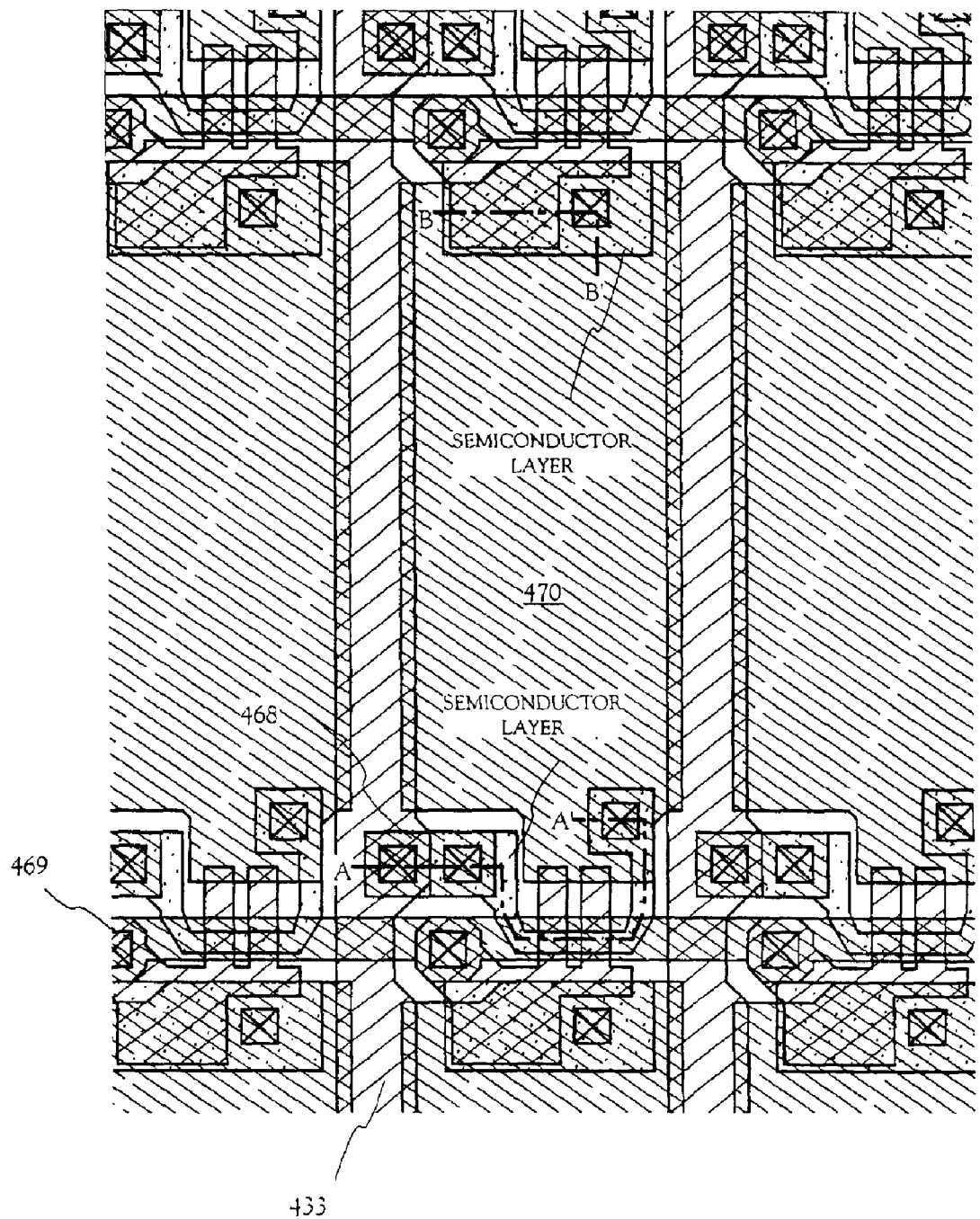
FIG. 11 is a top view showing a pixel of a pixel portion of Embodiment 8.

FIG. 11 shows the top view of the pixel portion of the active matrix substrate which is manufactured in this embodiment. In the figure, parts corresponding to those in FIGS. 8A to 11 are denoted by the same reference numerals. Chain line A–A' in FIG. 11 correspond to sections taken along chain line A–A' in FIG. 10. Chain line B–B' in FIG. 11 correspond to sections taken along chain line B–B' in FIG. 10.

Incidentally, this embodiment can be combined with Embodiments 1 to 4 and Embodiments 6 and 7 at will.

[Embodiment 9]

Figure 12:
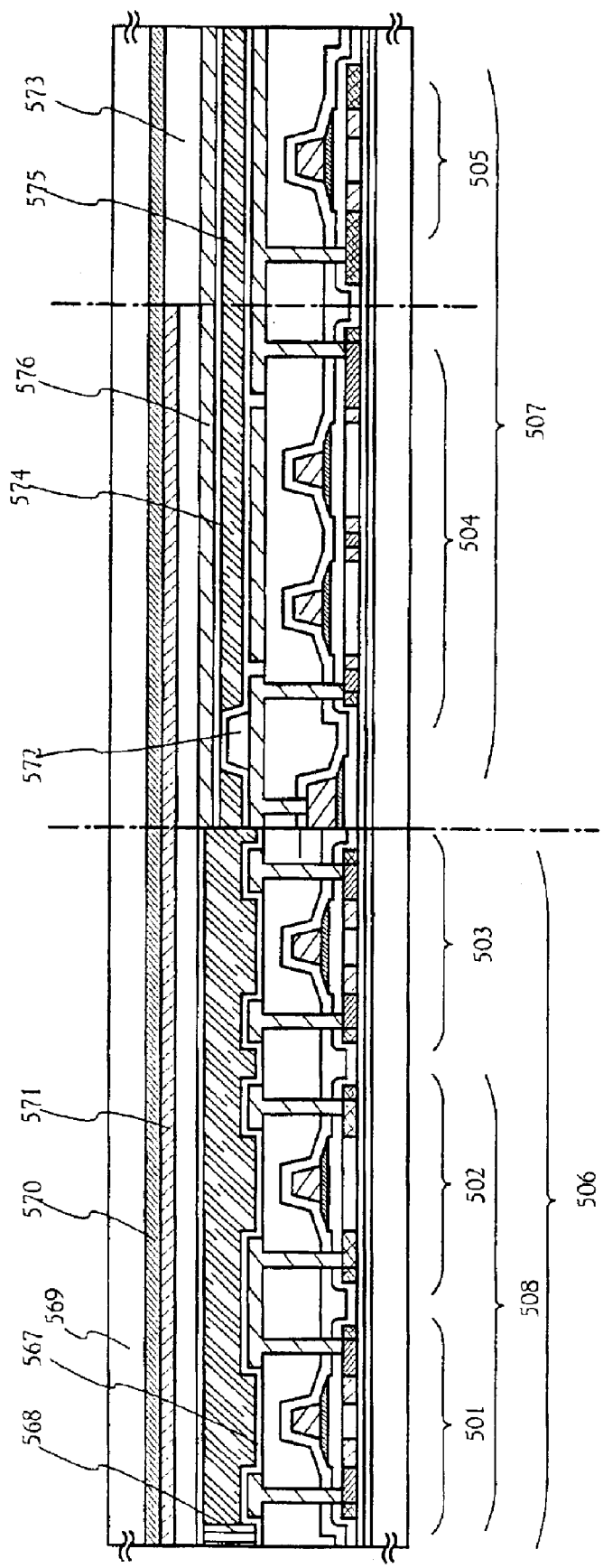
FIG. 12 is a cross sectional diagram showing a process of manufacturing an active matrix liquid crystal display device of Embodiment 9.

A process of manufacturing a reflection type liquid crystal display device from the active matrix substrate manufactured in Embodiment 8 is explained below in this embodiment. FIG. 12 is used in the explanation.

An active matrix substrate in the state of FIG. 10 is first obtained in accordance with Embodiment 8, an orientation film 567 is then formed on at least the pixel electrode 470 on the active matrix substrate of FIG. 10, and a rubbing process is performed. Note that, before forming the orientation film 567 in this embodiment, column shaped spacer 572 is formed in desired positions by patterning an organic resin film, such as an acrylic resin film, in order to maintain a gap between substrates. Further, spherical shape spacers may also be distributed over the entire surface of the substrate instead of the column shaped spacers.

An opposing substrate 569 is prepared next. Coloring layers 570 and 571, and a leveling film 573 are then formed on the opposing substrate 569. The red coloring layer and a blue coloring layer are overlapped to form a light shielding portion. Furthermore, the light shielding portion may also be formed by overlapping a portion of the red coloring layer with a green coloring layer.

The substrate shown in Embodiment 8 is used in this embodiment. Therefore, with the top surface diagram of the pixel portion of Embodiment 8 shown in FIG. 11, it is necessary that, at least, the gap between the gate wiring 469 and the pixel electrode 470, the gap between the gate wiring 469 and the connection electrode 468, and the gap between the connection electrode 468 and the pixel electrode 470 be shielded from light. Each of the coloring layers are arranged such that the light shielding portions made from the lamination of the coloring layers are formed in positions that must be shielded from light, and then are joined to the opposing substrate.

It is thus made possible to reduce the number of process steps by performing light shielding of the respective gaps between the pixels by using the light shielding portions.

An opposing electrode 576 made from a transparent conductive film is formed on the leveling film 573 over at least the pixel portion, an orientation film 574 is formed over the entire surface of the opposing substrate, and a rubbing process is performed.

The active matrix substrate on which the pixel portion and the driver circuit are formed, and the opposing substrate are then joined by a sealing material 568. A filler is mixed into the sealing material 568, and the two substrates are joined while maintaining a uniform gap in accordance with the filler and the column shape spacers. A liquid crystal material 575 is then injected between both substrates, and the substrates are completely sealed by using a sealant (not shown in the figure). A known liquid crystal material may be used for the liquid crystal material 575. The reflection type liquid crystal display device shown in FIG. 12 is thus completed. Note, in a case that a transparent conductive film is used as the pixel electrode, it is possible to fabricate a transmission type liquid crystal display device. The active matrix substrate or the opposing substrate is then cut into a desired shape if necessary. In addition, a polarizing plate (not shown in the figure) is attached to only the opposing substrate. An FPC is then attached using a known technique.

Note that it is possible to freely combine this embodiment with Embodiments 1 to 4, and Embodiments 6 to 8. A liquid crystal display panel thus manufactured as described above can be used as a display portion in various types of electronic equipment.

[Embodiment 10]

The CMOS circuit and the pixel portion formed by implementing the invention can be used in various electro-optical devices (which is also referred to as an active matrix type liquid crystal display device). That is, the present invention can be implemented in all of electric apparatuses (electronic equipments) integrated with the electro-optical devices at display portions thereof.

As such electric apparatus, there are pointed out a video camera, a digital camera, a projector, a head mount display (goggle type display), a car navigation system, a car stereo, a personal computer, a portable information terminal (mobile computer, portable telephone or electronic book) and the like. Examples of these are shown in FIGS. 13A to 13F, FIGS. 14A to 15D and FIGS. 15A to 15C.

FIG. 13A shows a personal computer including a main body 3001, an image input portion 3002, a display portion 3003 and a keyboard 3004. The invention is applicable to the display portion 3003.

FIG. 13B shows a video camera including a main body 3101, a display portion 3102, a voice input portion 3103, operation switches 3104, a battery 3105 and an image receiving portion 3106. The invention is applicable to the display portion 3102.

FIG. 13C shows a mobile computer including a main body 3201, a camera portion 3202, an image receiving portion 3203, an operation switch 3204 and a display portion 3205. The invention is applicable the display portion 3205.

FIG. 13D shows a goggle type display including a main body 3301, a display portion 3302 and an arm portion 3303. The invention is applicable to the display portion 3302.

FIG. 13E shows a player using a record medium recorded with programs (hereinafter, referred to as record medium) including a main body 3401, a display portion 3402, a speaker portion 3403, a record medium 3404 and an operation switch 3405. The player uses DVD (Digital Versatile Disc) or CD as the record medium and can enjoy music, enjoy movie and carry out game or Internet. The invention is applicable to the display portion 3402.

FIG. 13F shows a digital camera including a main body 3501, a display portion 3502, an eye contact portion 3503, operation switches 3504 and an image receiving portion (not illustrated). The invention is applicable to the display portion 3502.

Figure 14A:
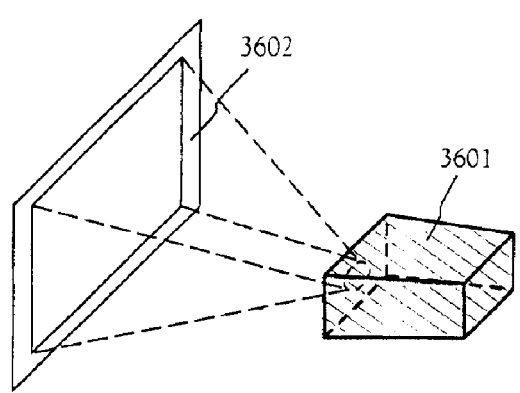
FIGS. 14A to 14D are diagrams showing examples of electric apparatuses of Embodiment 10.

FIG. 14A shows a front type projector including a projection apparatus 3601 and a screen 3602. The invention is applicable to a liquid crystal display apparatus 3808 constituting a portion of the projection apparatus 3601 and other driver circuit.

Figure 14B:
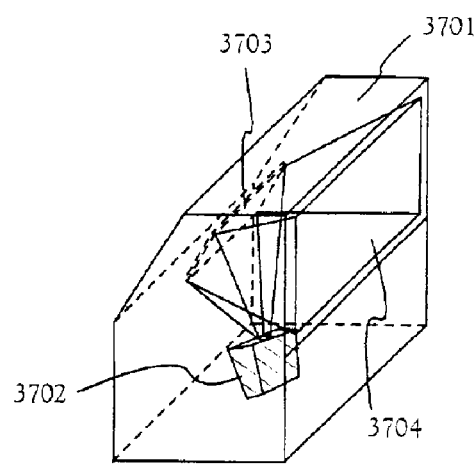

FIG. 14B shows a rear type projector including a main body 3701, a projection apparatus 3702, a mirror 3703 and a screen 3704. The invention is applicable to a liquid crystal display apparatus 3808 constituting a portion of the projection apparatus 3702 and other driver circuit.

Figure 14C:
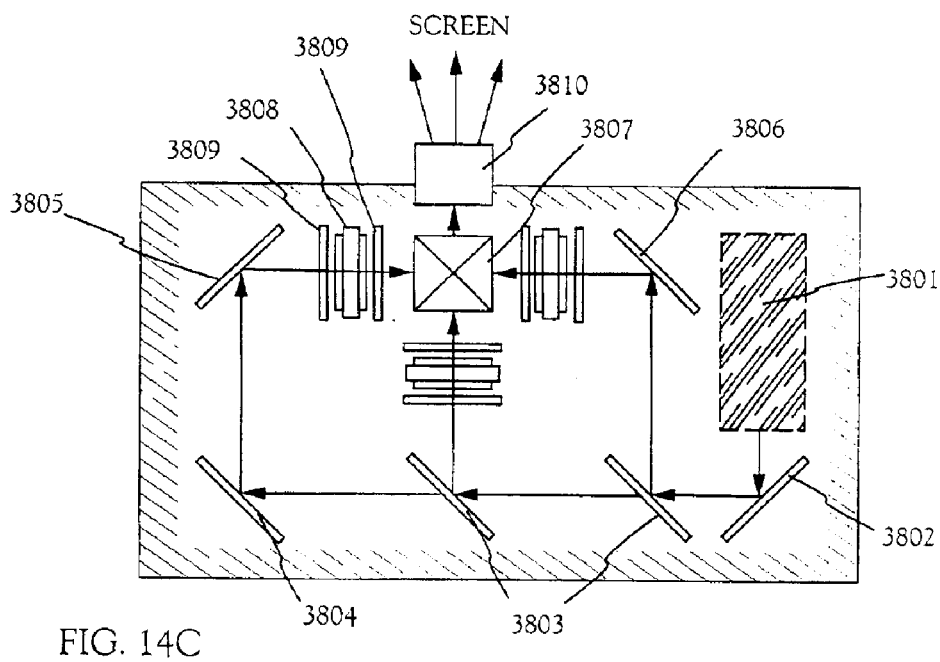

Further, FIG. 14C is a view showing an example of a structure of the projection apparatus 3601 and 3702 in FIG. 14A and FIG. 14B, respectively. The projection apparatus 3601 or 3702 is constituted by a light source optical system 3801, mirrors 3802, and 3804 through 3806, a dichroic mirror 3803, a prism 3807, liquid crystal display devices 3808, phase difference plates 3809 and a projection optical system 3810. The projection optical system 3810 is constituted by an optical system including a projection lens.

Although the embodiment shows an example of three plates type, the embodiment is not particularly limited thereto but may be of, for example, a single plate type. Further, a person of executing the embodiment may pertinently provide an optical system such as an optical lens, a film having a polarization function, a film for adjusting a phase difference or an IR film in an optical path shown by arrow marks in FIG. 14C.

Figure 14D:
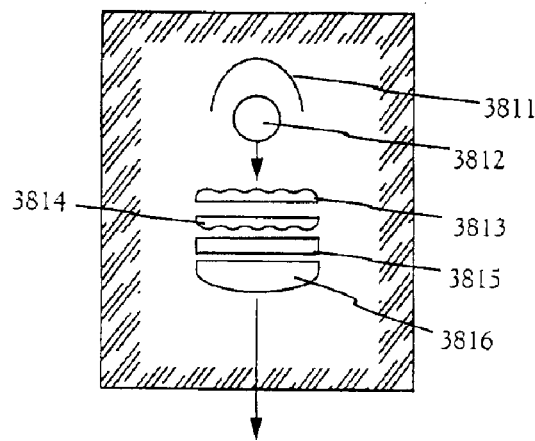

Further, FIG. 14D is a view showing an example of a structure of the light source optical system 3801 in FIG. 14C. According to the embodiment, the light source optical system 3801 is constituted by a reflector 3811, a light source 3812, lens arrays 3813 and 3814, a polarization conversion element 3815 and a focusing lens 3816. Further, the light source optical system shown in FIG. 14D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIGS. 14A, 14B and 14C, there is shown a case of using a transmission type electric apparatus and an example of applying a reflection type electro-optical device and light emitting device are not illustrated.

Figure 15A:
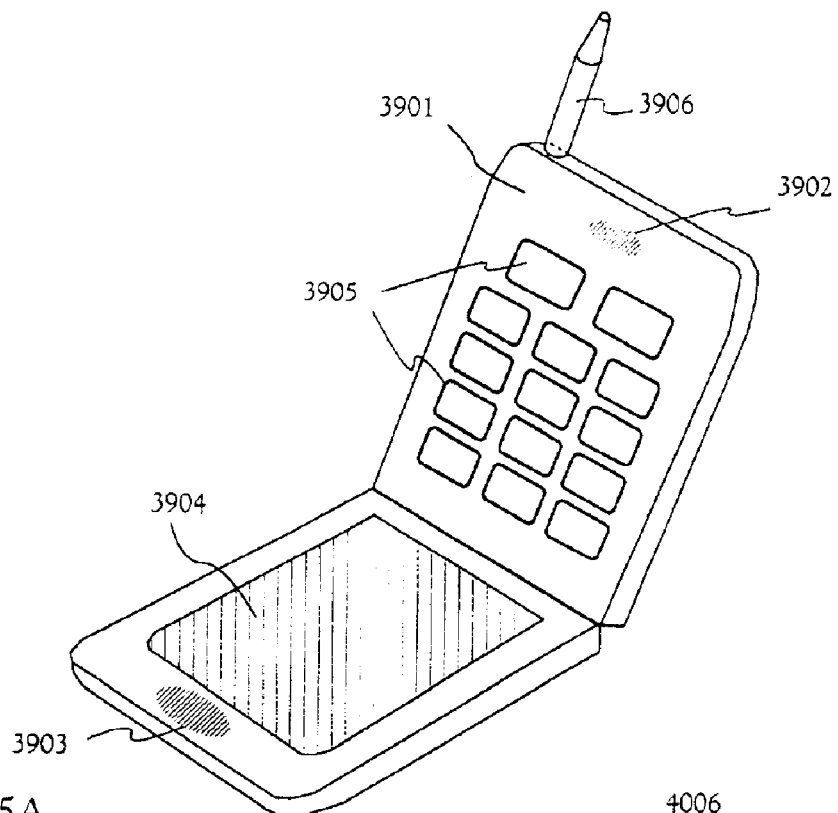
FIGS. 15A to 15C are diagrams showing examples of electric apparatuses of Embodiment 10.

FIG. 15A shows a portable telephone including a main body 3901, a voice output portion 3902, a voice input portion 3903, a display portion 3904, operation switches 3905 and an antenna 3906. The invention is applicable to the display portion 3904.

Figure 15B:
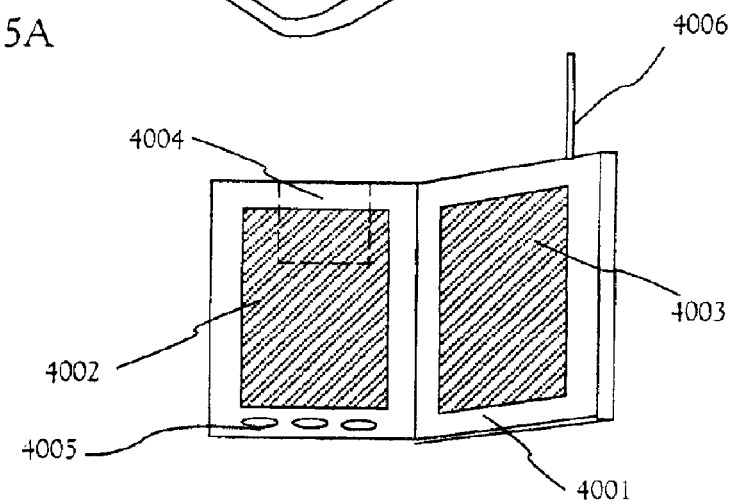

FIG. 15B shows a portable book (electronic book) including a main body 4001, display portions 4002 and 4003, a record medium 4004, operation switches 4005 and an antenna 4006. The invention is applicable to the display portions 4002 and 4003.

Figure 15C:
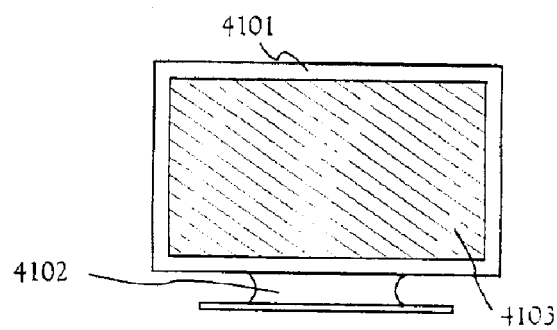
Figure 16:
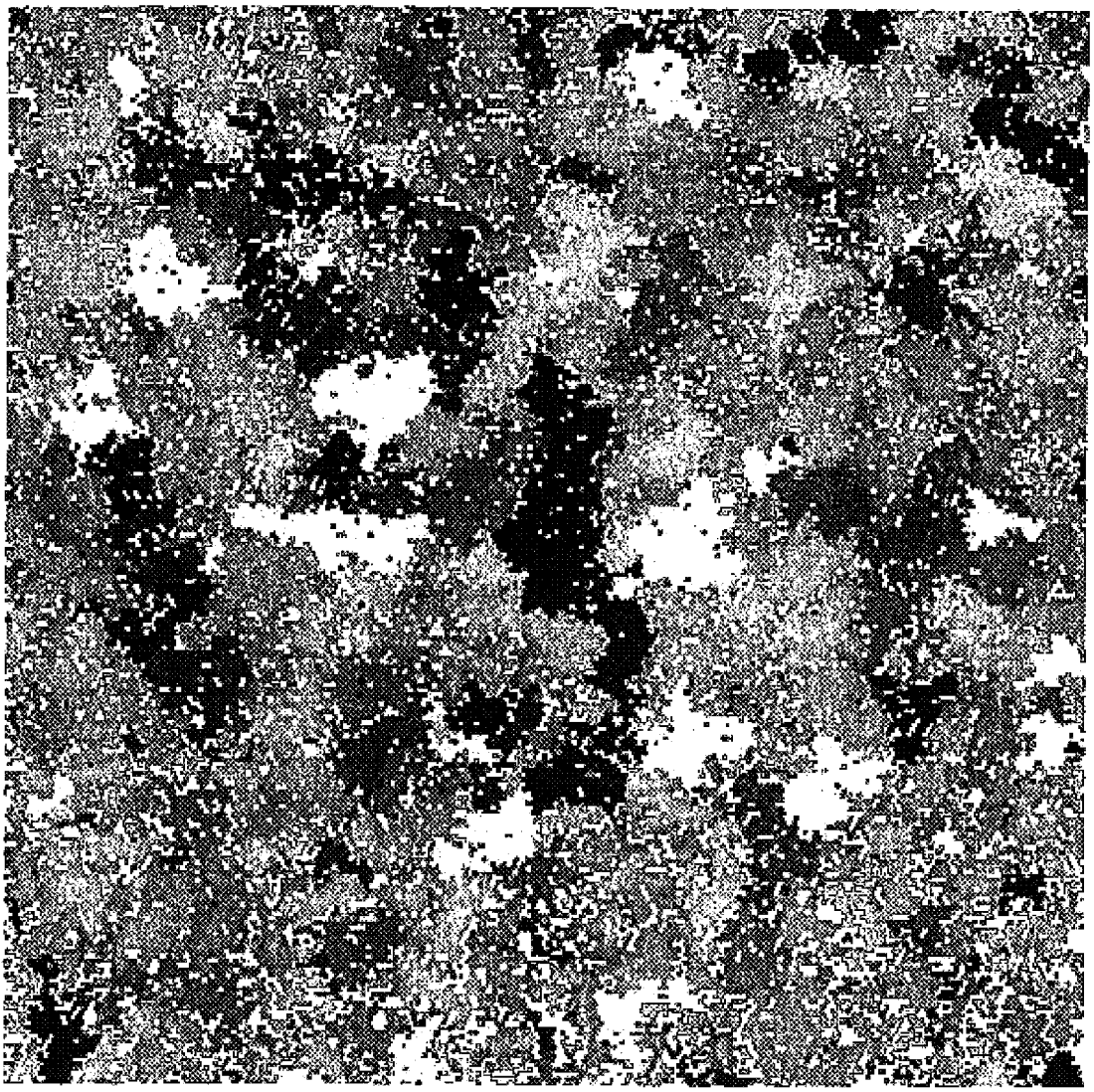
FIG. 16 shows EBSP evaluation results for a semiconductor film of the present invention.
Figure 17:
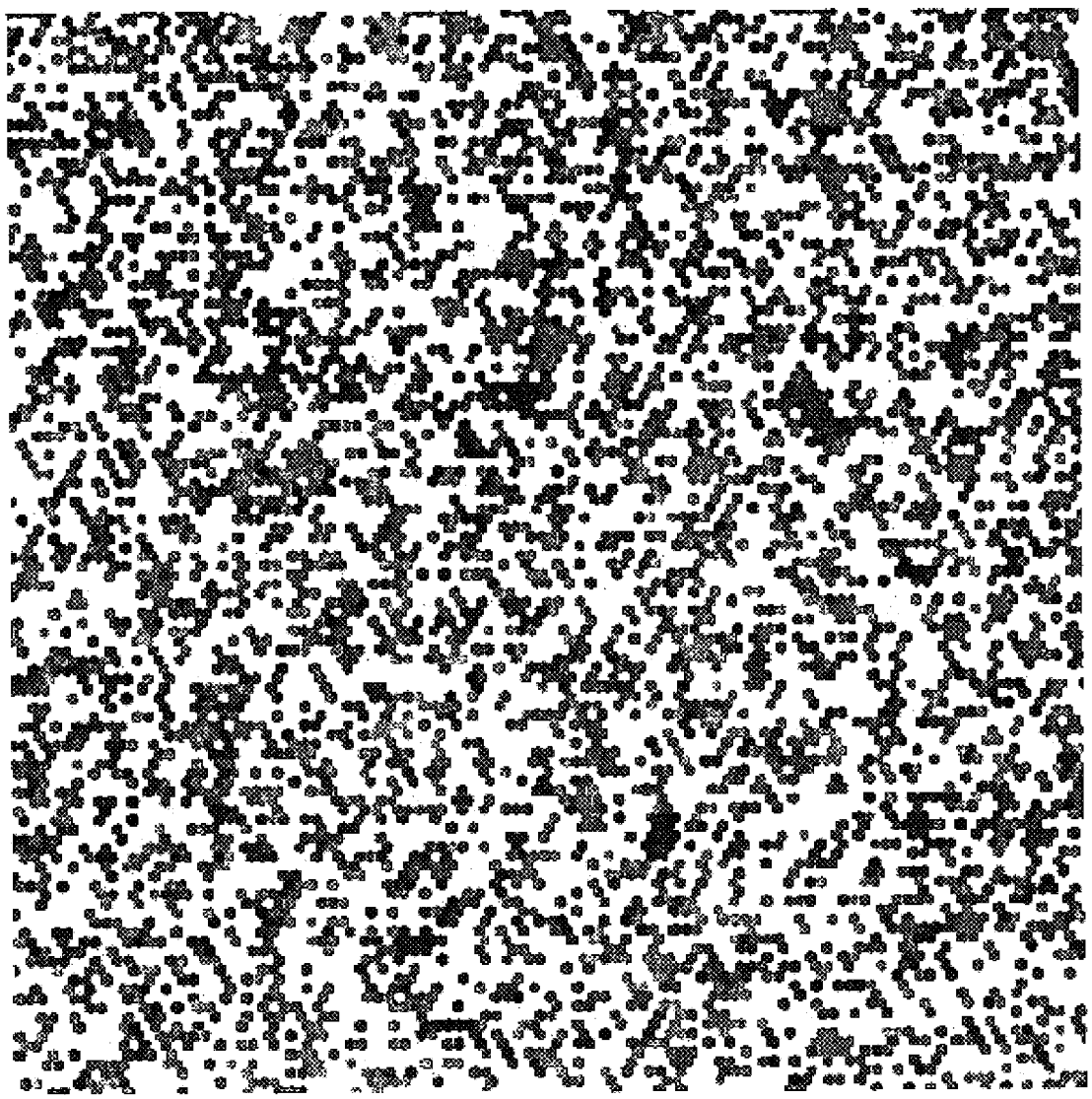
FIG. 17 shows EBSP evaluation results for a conventional LPS film.
Figure 18:
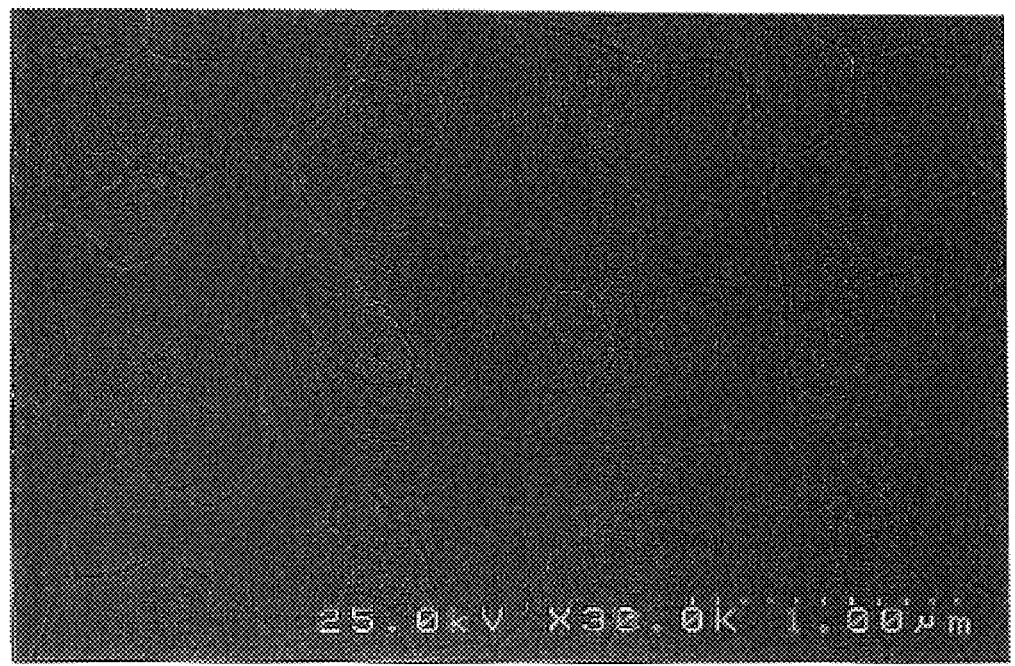
FIG. 18 shows SEM observation results for a semiconductor film of the present invention.
Figure 19:
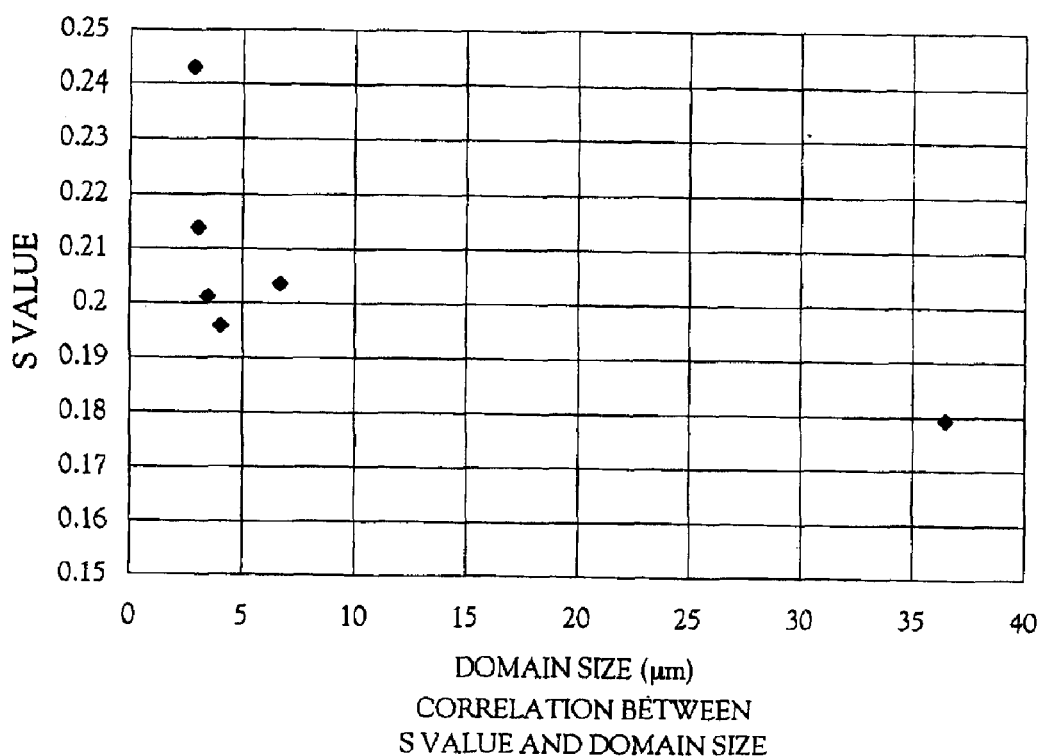
FIG. 19 shows the relationship between S value and domain size of the present invention.
Figure 20:
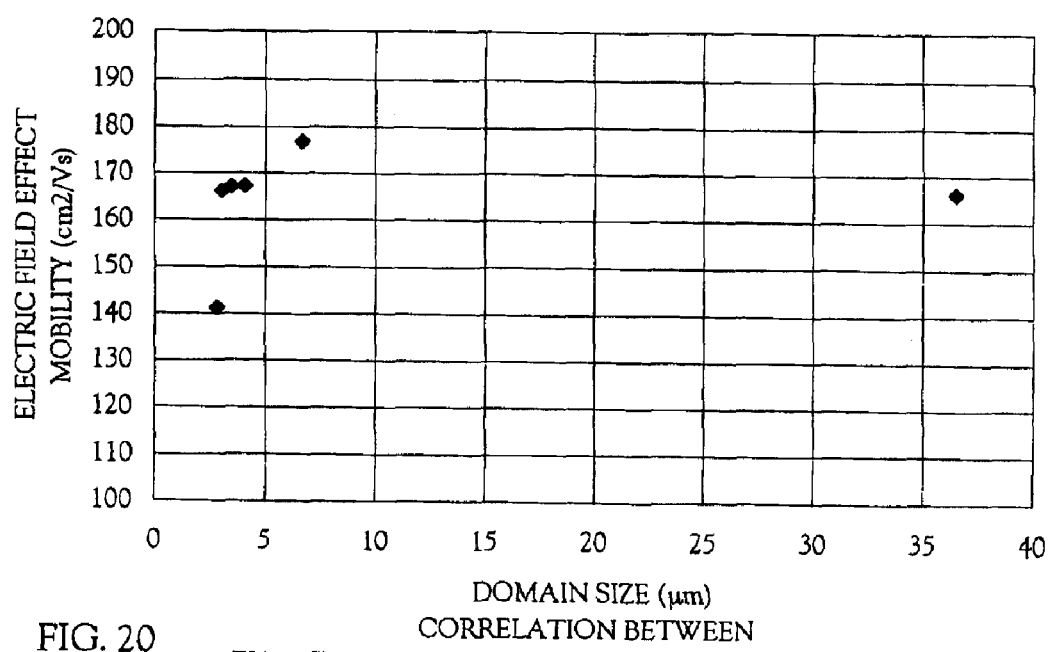
FIG. 20 shows the relationship between mobility and domain size of the present invention.

FIG. 15C shows a display including a main body 4101, a support base 4102 and a display portion 4103. The invention is applicable to the display portion 4103. The display according to the invention is advantageous particularly in the case of large screen formation and is advantageous in the display having a diagonal length of 10 inch or more (particularly, 30 inch or more).

As has been described, the range of applying the invention is extremely wide and is applicable to electric apparatus of all the fields. Further, the electric apparatus of the embodiment can be realized by using any constitution comprising any combinations of Embodiments 1 to 4 and Embodiments 6 to 10.

Fundamental advantages like the following can be obtained by employing the structure of the present invention:

(a) Dispersion in the electrical characteristics of TFTs can be reduced if the TFTs are manufactured based on crystalline semiconductor films obtained in accordance with the present invention;

(b) The electrical characteristics of TFTs can be improved if the TFTs are manufactured based on crystalline semiconductor films obtained in accordance with the present invention; and (c) Deterioration in productivity and throughput can be kept to a minimum if the laser processing apparatus of the present invention is used.

What is claimed is:

1. A method of manufacturing a semiconductor device, said method comprising the steps of:

forming an amorphous semiconductor film over a substrate;

introducing a metallic element into the amorphous semiconductor film;

forming a first crystalline semiconductor film by heating the amorphous semiconductor film;

removing an oxide film formed on a surface of the first crystalline semiconductor film;

forming a clean oxide film on the first crystalline semiconductor film by spraying ozone water;

forming a second crystalline semiconductor film by irradiating the first crystalline semiconductor film with a laser beam in an inert gas atmosphere.

2. A method according to claim 1, wherein the inert gas atmosphere includes oxygen at a concentration in a range of equal to or less than 20 ppm.

3. A method according to claim 1, wherein the oxide film on the surface of the first crystalline semiconductor film is removed by using hydrofluoric acid.

4. A method according to claim 1, wherein the inert gas atmosphere is one selected from the group consisting of a nitrogen atmosphere, a hydrogen atmosphere, and a rare gas atmosphere.

5. A method according to claim 1, wherein the matallic element comprises at least one selected from the group consisting of Ni, Pd, Pt, Cu, Ag, Au, Al, In, Sn and Pd.

6. A method according to claim 1, wherein the metallic element is one selected from the group consisting of elements belonging to group 8, group 11, group 14, and group 15 of the periodic table.

7. A method according to claim 1, wherein the amorphous semiconductor film is an amorphous silicon film.

8. A method according to claim 1, wherein the first crystalline semiconductor film is a crystalline silicon film.

9. A method according to claim 1, wherein the second crystalline semiconductor film is a crystalline silicon film.

* * * * *